United States Patent
Kanda et al.

(10) Patent No.: US 9,570,188 B2
(45) Date of Patent: Feb. 14, 2017

(54) SEMICONDUCTOR DEVICE

(71) Applicant: Renesas Electronics Corporation, Tokyo (JP)

(72) Inventors: Akihiko Kanda, Tokyo (JP); Tamiyu Kato, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/015,894

(22) Filed: Feb. 4, 2016

(65) Prior Publication Data
US 2016/0276038 A1 Sep. 22, 2016

(30) Foreign Application Priority Data

Mar. 17, 2015 (JP) .................................. 2015-053205

(51) Int. Cl.
*G11C 16/10* (2006.01)
*G11C 16/28* (2006.01)

(52) U.S. Cl.
CPC ............... *G11C 16/28* (2013.01); *G11C 16/10* (2013.01)

(58) Field of Classification Search
CPC ........................... G11C 16/10; G11C 16/0483
USPC ........................................ 365/185.2, 185.24
See application file for complete search history.

(56) References Cited

U.S. PATENT DOCUMENTS

| 5,430,409 | A | * | 7/1995 | Buck | ...................... | H03K 5/153 |
| | | | | | | 330/149 |
| 7,679,463 | B2 | * | 3/2010 | Pernia | ...................... | H03L 1/022 |
| | | | | | | 331/108 C |
| 8,384,031 | B2 | * | 2/2013 | Rueger | .................. | G01S 3/7803 |
| | | | | | | 250/338.1 |
| 9,001,579 | B2 | * | 4/2015 | Song | ........................ | G11C 7/04 |
| | | | | | | 365/185.03 |
| 9,384,696 | B2 | * | 7/2016 | Okuno | ................. | G09G 3/3258 |
| 9,390,843 | B2 | * | 7/2016 | Kumagai | ................. | H01C 1/16 |
| 9,412,940 | B2 | * | 8/2016 | Sacchetto | .......... | G11C 13/0007 |
| 9,448,579 | B2 | * | 9/2016 | Marinca | .................. | G05F 3/185 |

FOREIGN PATENT DOCUMENTS

| JP | 2000-011671 A | 1/2000 |
| JP | 2014-026680 A | 2/2014 |

* cited by examiner

*Primary Examiner* — Michael Tran
(74) *Attorney, Agent, or Firm* — Sughrue Mion, PLLC

(57) ABSTRACT

The trimming range of a reference current is extended larger than that of the related art. A semiconductor device includes a reference current generating circuit that generates a reference current. The reference current includes a first base current, a second base current base current, a second base current, a temperature compensating current, and a voltage compensating current. The first base current can be trimmed. The second base current flowing opposite to the first base current can be trimmed. The temperature compensating current flows in the same direction as the first base current and has higher temperature dependence than the first and second base currents. The voltage compensating current flows in the same direction as the first base current and depends on power supply voltages more than the base currents.

19 Claims, 17 Drawing Sheets

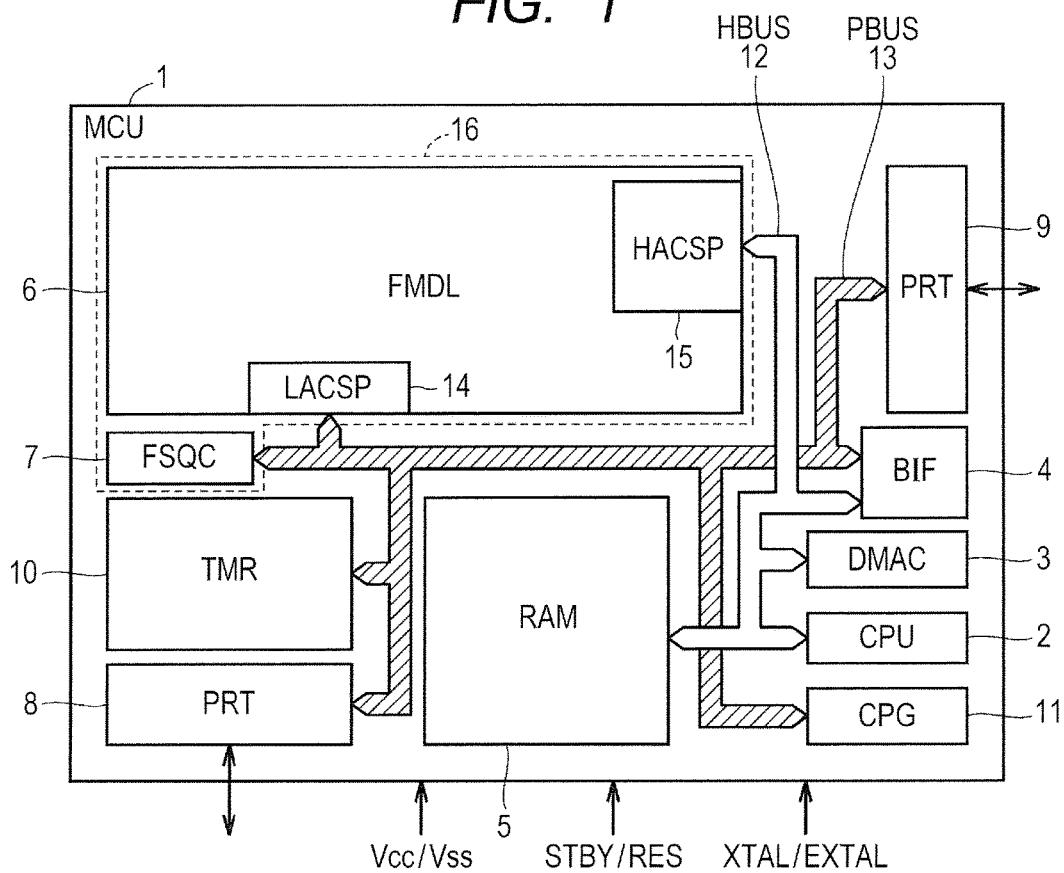
FIG. 1
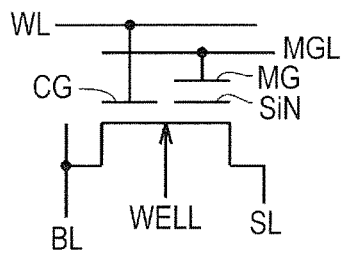
FIG. 2A
FIG. 2B
|   | BL | CG | MG | SL | WELL |   |
|---|---|---|---|---|---|---|
| READING | 1.5 V | 1.5 V | 0 V | 0 V | 0 V |  |
| INCREASE Vth | 0 V | 1.5 V | 10 V | 6 V | 0 V | (IN BITS) |
| REDUCE Vth | Hi-Z | 0 V | −10 V | 6 V | 0 V | (IN BATCHES) |

|  | BL | WL | SL | WELL |  |
|---|---|---|---|---|---|
| READING | 1.5 V | 1.5 V | 0 V | 0 V |  |
| INCREASE Vth | 6 V | 10 V | 0 V | 0 V | (IN BITS) |
| REDUCE Vth | 10 V | −10 V | 10 V | 10 V | (IN BATCHES) |

|  | BL | WL | SL | WELL |  |
|---|---|---|---|---|---|
| READING | 1.5 V | 1.5 V | 0 V | 0 V |  |
| INCREASE Vth | −10 V | 10 V | −10 V | −10 V | (IN BATCHES) |
| REDUCE Vth | 10 V | −10 V | 0 V | 0 V | (IN BITS) |

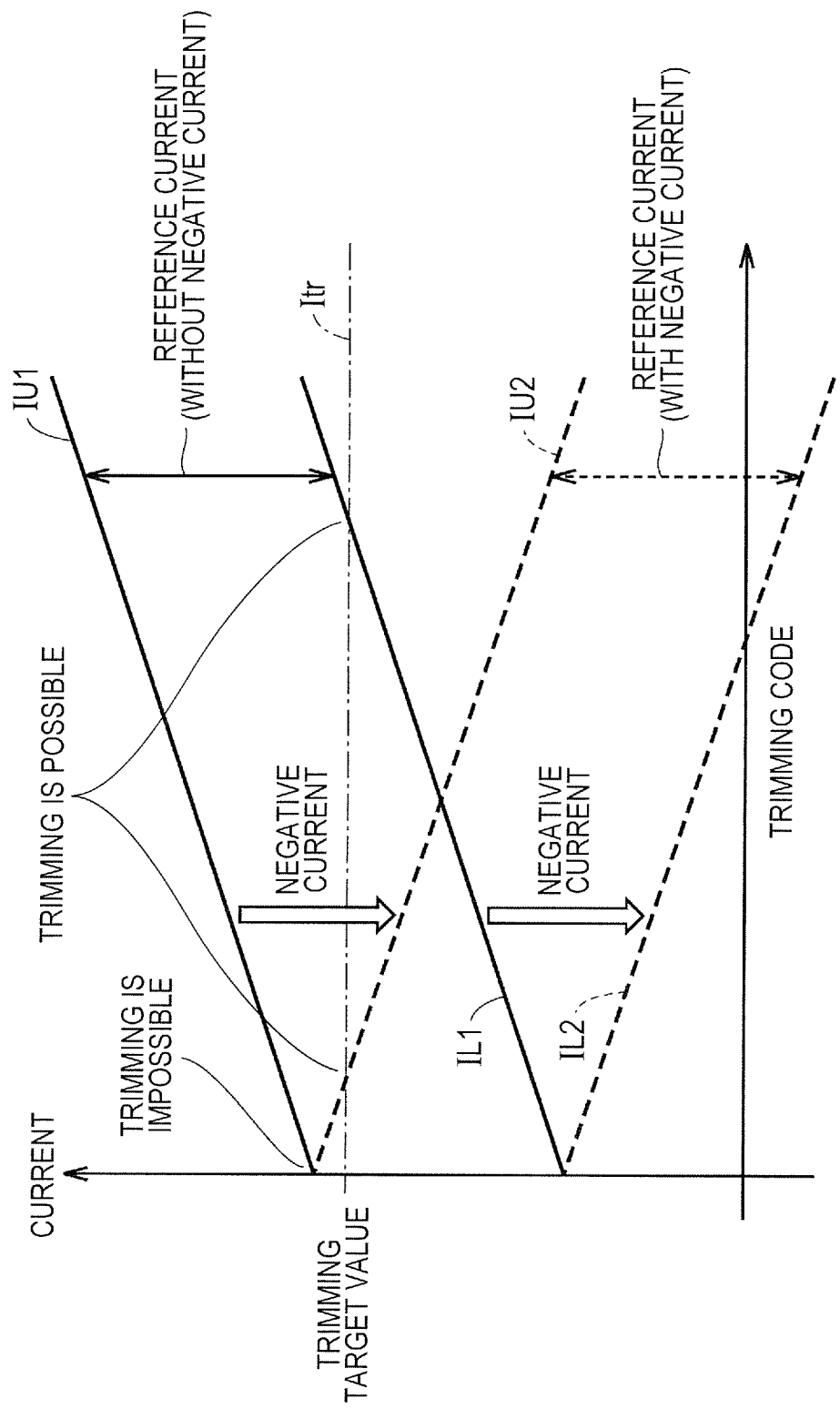

SEMICONDUCTOR DEVICE

CROSS-REFERENCE TO RELATED APPLICATIONS

The disclosure of Japanese Patent Application No. 2015-053205 filed on Mar. 17, 2015 including the specification, drawings and abstract is incorporated herein by reference in its entirety.

BACKGROUND

This disclosure relates to a semiconductor device, and properly used for, for example, a semiconductor device including a nonvolatile memory.

In nonvolatile memories such as an EEPROM (Electrically Erasable Programmable Read-Only Memory) and a flash memory, a current passing through a memory cell to be read is compared with a reference current, allowing reading of memory cell data ("1" or "0") to be read.

Generally, a current passing through a memory cell (hereinafter referred to as "memory cell current") fluctuates depending on the temperature, the power supply voltage, and the manufacturing process. Thus, to obtain a reading margin during reading of data, the reference current needs to depend on a temperature and a power supply voltage like the memory cell current.

The related arts will be discussed below. Japanese Unexamined Patent Publication No. 2000-11671 (Patent Literature 1) discloses a semiconductor memory where a reading voltage margin is obtained by an internal voltage having the same temperature dependence as a memory cell threshold voltage. Japanese Unexamined Patent Publication No. 2014-26680 (Patent Literature 2) discloses a current compensating circuit used for suppressing reading voltage variations caused by an IR drop of a control gate voltage.

SUMMARY

In an actual circuit, a reference current is generated by adding a temperature compensating current that depends on a temperature and a voltage compensating current that depends on a power supply voltage to a base current that hardly depends on a temperature and a power supply voltage. The magnitude of the base current can be trimmed to suppress the influence of variations caused by the manufacturing process.

However, a sufficient reading margin cannot be obtained because circuit characteristics deviate from design values according to variations in the manufacturing process. For example, if a temperature compensating current or a voltage compensating current increase more than expected in the generation of the reference current, the base current trimmed to 0 cannot suppress the magnitude of the reference current within a proper range.

Other problems and new characteristics will become apparent from the description and accompanying drawings of the specification.

A reference current generating circuit provided in a semiconductor device according to an embodiment generates a reference current including first and second base currents, a temperature compensating current, and a voltage compensating current. The first base current is a current in the same direction as the temperature compensating current and a power supply compensating current. The second base current is a current opposite to the temperature compensating current and the power supply compensating current. The first and second base currents can be trimmed.

According to the embodiment, the trimming range of the reference current can be extended larger than the related art.

BRIEF DESCRIPTION OF THE DRAWINGS

FIG. 1 is a block diagram showing the configuration of a semiconductor device according to a first embodiment;

FIGS. 2A and 2B are explanatory drawings of the configuration and operation of a memory cell;

FIG. 21 schematically shows the relationship between a reference current and a trimming code according to a third embodiment.

DETAILED DESCRIPTION

Figures 3A, 3B, 3C:
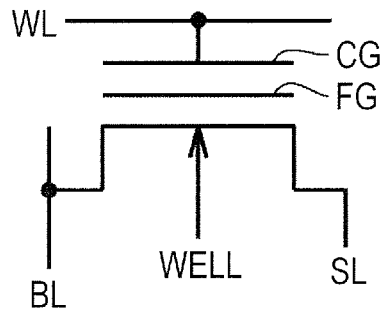
FIGS. 3A to 3C are explanatory drawings of the configuration and operation of a memory cell (stacked-gate memory cell)

Embodiments will be specifically described below with reference to the accompanying drawings. The same or equivalent parts in the drawings are indicated by the same reference numerals and the explanation thereof may not be repeated.

First Embodiment

The Overall Configuration of a Semiconductor Device

FIG. 1 is a block diagram showing the configuration of a semiconductor device according to a first embodiment. FIG. 1 shows the configuration of a microcomputer (MCU)1 containing a flash memory 16 as an example of the semiconductor device. A reference current generating circuit 50 according to this embodiment is applicable to a semiconductor device in which only the flash memory 16 is mounted on a single silicon substrate.

Referring to FIG. 1, the microcomputer 1 is a single semiconductor chip included of, for example, single crystal silicon. The microcomputer is formed using, for example, a CMOS (complementary metal oxide semiconductor) integrated circuit technology.

As shown in FIG. 1, the microcomputer 1 includes a central processing unit (CPU) 2, a random access memory (RAM) 5, and a flash memory module (FMDL) 6. The central processing unit 2 includes a command control part and an executing part that executes commands. The random access memory 5 is used for, for example, the work region of the central processing unit 2. The flash memory module 6 is provided as a nonvolatile memory module that store data and programs.

The microcomputer 1 includes a direct memory access controller (DMAC) 3, a bus interface circuit (BIF) 4, a flash sequencer (FSQC) 7, external input/output ports (PRT) 8 and 9, a timer (TMR) 10, a clock pulse generator (CPG) 11, a high-speed bus (HBUS) 12, and a peripheral bus (PBUS) 13.

The bus interface circuit 4 performs bus interface control or bus bridge control with the high-speed bus 12 and the peripheral bus 13. The flash sequencer 7 performs command access control for the flash memory module (FMDL) 6. The clock pulse generator 11 generates an internal clock CLK for controlling the microcomputer 1.

The bus configuration of the microcomputer 1 in FIG. 1 is not particularly limited and includes the high-speed bus (HBUS) 12 and the peripheral bus (PBUS) 13. The high-speed bus 12 and the peripheral bus 13 each include, but not exclusively, a data bus, an address bus, and a control bus. The provision of the two buses, the high-speed bus 12 and the peripheral bus 13, achieves a lighter load than in the case where circuits are all coupled to a common bus. This can guarantee a high-speed access operation.

The high-speed bus 12 is coupled to the central processing unit 2, the direct memory access controller 3, the bus interface circuit 4, the random access memory 5, and the flash memory module 6. The peripheral bus 13 is coupled to the flash sequencer 7, the external input/output ports 8 and 9, the timer 10, and the clock pulse generator 11.

The microcomputer 1 further includes a clock terminal XTAL/EXTAL that is coupled to a radiator or receives an external clock, an external hardware standby terminal STBY that displays a standby state, an external reset terminal RES that indicates reset, an external power supply terminal Vcc, and an external ground terminal Vss.

In FIG. 1, the flash sequencer 7 acting as a logic circuit and the flash memory module 6 with an array configuration are designed using different CAD tools and thus are illustrated for convenience as separate circuit blocks, which include the single flash memory 16.

The flash memory module 6 is coupled to the high-speed bus (HBUS) 12 via a high-speed access port (HACSP) 15 for reading. The CPU 2 or the DMAC 3 can read-access the flash memory module 6 from the high-speed bus 12 through a high-speed access port 15. In access for writing and initialization (erasure) of the flash memory module 6, the CPU 2 or the DMAC 3 issues a command to the flash sequencer 7 via the bus interface circuit 4 through the peripheral bus (PBUS) 13. In response to the command, the flash sequencer 7 controls initialization or writing of the flash memory module from the peripheral bus PBUS through a low-speed access port (LACSP).

The Configuration and Operation of a Memory Cell

FIGS. 2A and 2B and 3A to 3C are explanatory drawings of the configuration and operation of a memory cell. FIGS. 2A and 2B show a split-gate flash memory device while FIGS. 3A to 3C show a stacked-gate flash memory cell.

Referring to FIG. 2A, the split-gate flash memory device includes a control gate CG and a memory gate MG that are arranged on a channel forming region between a source region and a drain region with a gate insulating film interposed between the channel forming region and the gates. A charge trap region (SiN) containing silicon nitride is arranged between the memory gate MG and the gate insulating film. The control gate CG is coupled to a word line WL while the memory gate MG is coupled to a memory gate selecting line MGL. The drain region (or the source region) near the control gate CG is coupled to a bit line BL while the source region (or the drain region) near the memory gate MG is coupled to a source line SL.

FIG. 2B shows an example of voltage setting of the bit line BL, the control gate CG, the memory gate MG, the source line SL, and a well region (WELL) during reading and writing (programs)/erasure of the split-gate flash memory device.

Specifically, a reduction in a threshold voltage Vth of a memory cell for data erasure requires settings such as BL=Hi-Z (high impedance), CG=0.0 V, MG=−10 V, SL=6 V, and WELL=0 V. Thus, electrons and positive holes are generated by a high field between the well region (WELL) and the memory gate MG and then the positive holes are injected into the charge trap region (SiN) from the well region (WELL). This processing is performed on a plurality of memory cells sharing the memory gate.

An increase in the threshold voltage Vth of the memory cell for data writing requires settings such as BL=0 V, CG=1.5 V, MG=10 V, SL=6 V, and WELL=0 V. In this case, a writing current passing through the bit line from the source line SL generates hot electrons on the boundary of the control gate and the memory gate. The generated hot electrons are injected into the charge trap region (SiN). The electron injection is determined depending on whether to pass a bit line current and thus is controlled in bits.

During reading, for example, BL=1.5 V, CG=1.5 V, MG=0 V, SL=0 V, and WELL=0 V are set. A decrease in the threshold voltage Vth of the memory cell reduces the resistance of the memory cell (on state), whereas an increase in the threshold voltage Vth raises the resistance of the memory cell (off state).

The stacked-gate flash memory device in FIG. 3A is configured such that a floating gate FG and the control gate CG are stacked on the channel forming region between the source region and the drain region with the gate insulating film interposed between the channel forming region and the gates. The control gate CG is coupled to the word line WL. The drain region is coupled to the bit line BL while the source region is coupled to the source line SL.

FIGS. 3B and 3C show examples of voltage settings of the bit line BL, the word line WL, the source line SL, and the well region (WELL) during reading and writing/erasure of the stacked-gate flash memory device. FIG. 3B shows a voltage setting example in which the threshold voltage Vth is increased by a hot carrier writing method and the threshold voltage Vth is reduced by emitting electrons to the well region WELL. FIG. 3C shows a voltage setting example in which the threshold voltage Vth is increased by an FN tunnel writing method and the threshold voltage Vth is reduced by emitting electrons to the source line SL.

Figure 4A:
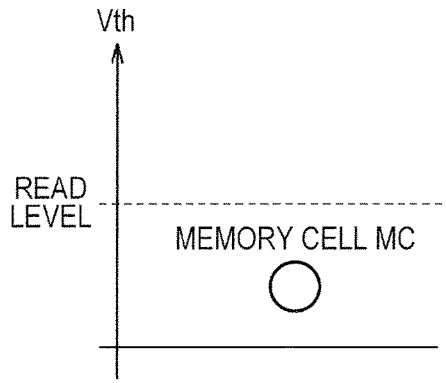
FIGS. 4A and 4B are explanatory drawings showing cell data of the memory cell.
Figure 4B:
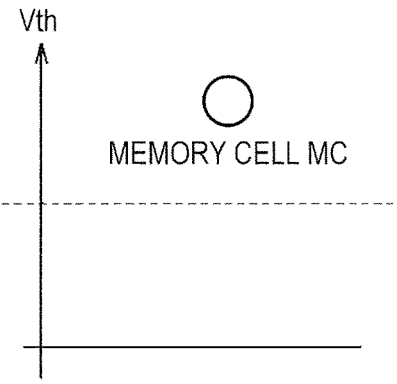

FIGS. 4A and 4B are explanatory drawings showing cell data of the memory cell. In the flash memory module of the embodiment, 1-bit information is stored using a nonvolatile memory. Specifically, 1-bit data is stored in a rewritable nonvolatile memory cell MC in a memory array. As shown in FIG. 4A, cell data "1" indicates that the threshold voltage Vth of the memory cell MC is lower than a reference read level (low-threshold voltage state). As shown in FIG. 4B, cell data "0" indicates that the threshold voltage of the memory cell MC is higher than the read level (high-threshold voltage state). Thus, a cell current of the cell data "1" is larger than that of the cell data "0". The cell data is read by comparing a cell current and a reference current. The data reading method will be referred to as a reference current reading method.

A Configuration Example of the Flash Memory Module

Figure 5:
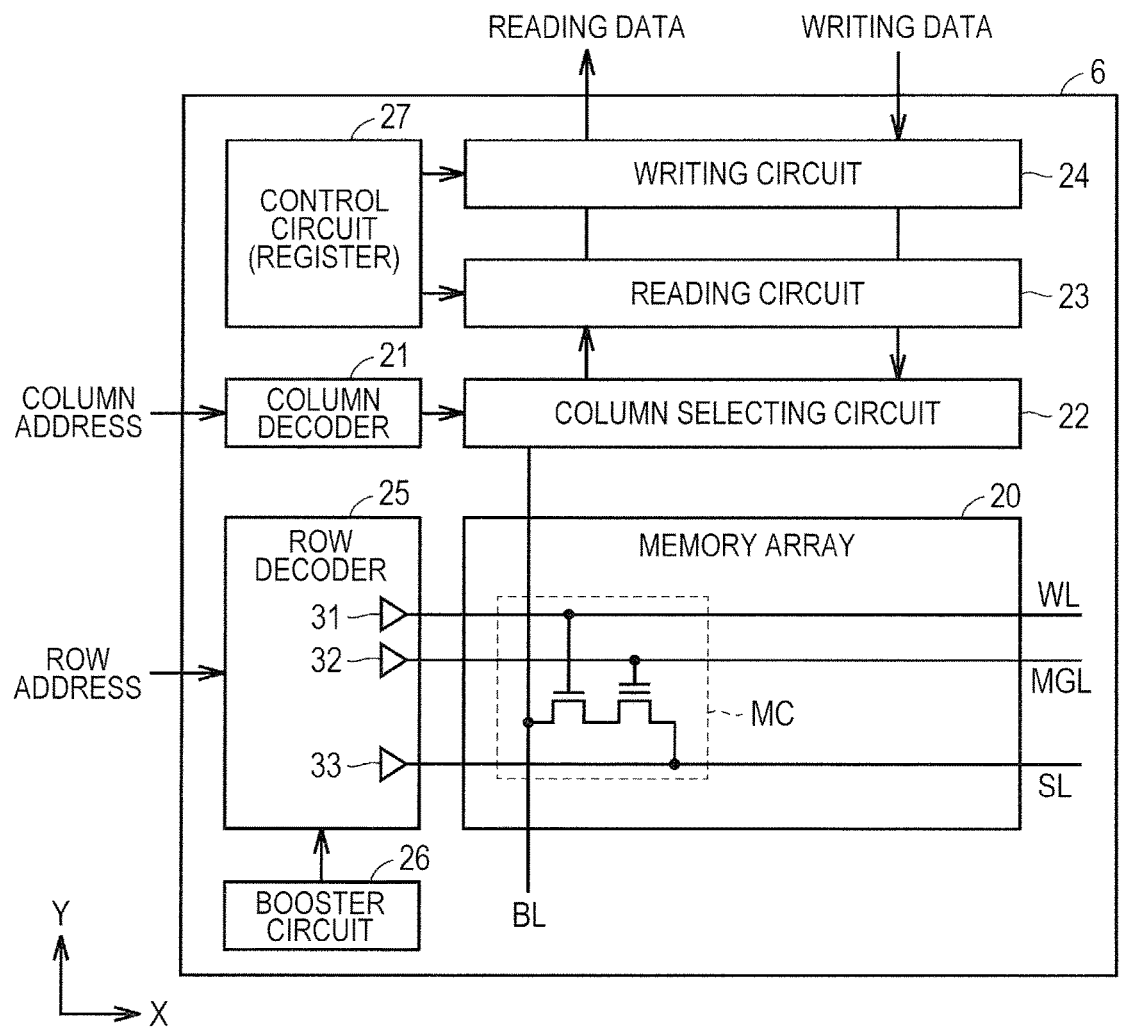
FIG. 5 is a block diagram showing a configuration example of the flash memory module 6 shown in FIG. 1.

FIG. 5 is a block diagram showing a configuration example of the flash memory module 6 shown in FIG. 1. Referring to FIG. 5, the flash memory module 6 includes a memory array 20, a column decoder 21, a column selecting circuit 22, a reading circuit 23, a writing circuit 24, a row decoder 25, a booster circuit 26, and a control circuit 27. The flash memory module 6 further includes a high-speed access port (HACSP) 15 and a low-speed access port (LASCP) 14 (FIG. 1), which are not shown in FIG. 5.

The memory array 20 includes the memory cells MC arranged in rows and columns. The memory cell in FIG. 5 is the split-gate memory cell shown in FIG. 2. The word line WL and the memory gate selecting line MGL are extended in the row direction (X direction) of the memory array 20 and are provided in each row. The bit line BL is extended in the column direction (Y direction) of the memory array 20 and is provided in each column. The common source line SL is coupled to tow or more rows.

Unlike in the example of FIG. 5, the memory cell MC may be the stacked-gate memory cell shown in FIG. 3. In this case, the memory gate selecting line MGL in FIG. 5 is not provided.

The column decoder 21 decodes a column address signal inputted through the high-speed access port 15 or the low-speed access port 14. The column selecting circuit 22 selects columns to be read and written in the memory array 20, according to the decoding result of the column address signal. Specifically, the column selecting circuit 22 couples the bit line of the reading target column to the reading circuit 23 during data reading and couples the bit line of the writing target column to the writing circuit 24 during data writing.

The reading circuit 23 reads data, which is stored in the memory cell MC to be read, by comparing the reference current and a cell current passing through the memory cell MC to be read in the column selected by the column selecting circuit 22. The read data is outputted to the CPU 2 and the DMAC 3, which are shown in FIG. 1, through the high-speed access port (HACSP).

The writing circuit 24 passes a writing current (program current) to the bit of the column selected by the column selecting circuit 22, according to written data. The written data is inputted to the writing circuit 24 through the low-speed access port (LACSP) 14.

The row decoder 25 decodes a row address signal inputted through the high-speed access port 15 or the low-speed access port 14. The row decoder 25 selects rows to be read, written, and erased in the memory array 20, according to the decoding result of the row address signal. Specifically, the row decoder 25 includes a plurality of word-line drivers 31, a plurality of memory-gate-line drivers 32, and a plurality of source line drivers 33. The row decoder 25 applies voltages to the word line WL, the memory gate selecting line MGL, and the source line SL of the selected rows according to the operation modes of reading, writing, and erasure by means of the drivers 31, 32, and 33. During data reading, the source line SL is coupled to the ground node Vss.

The booster circuit 26 generates a positive or negative high voltage used for writing and erasure and then supplies the voltage to the row decoder 25.

The control circuit 27 generates an internal control signal that determines timing for an internal operation of the flash memory 16, according to a timing signal supplied to the high-speed access port (HACSP) 15 from, for example, the CPU 2 illustrated in FIG. 1 and a command supplied to the low-speed access port 14 from the flash sequencer (FSQC) 7. The control circuit 27 further includes a register for outputting, for example, trimming data of the reference current generating circuit 50, which will be discussed later. The value of the register is written by the CPU 2 and so on. The control unit of the flash memory 16 includes the flash sequencer (FSQC) 7 and the control circuit 27.

The Configuration and Operation of the Reading Circuit

Figure 6:
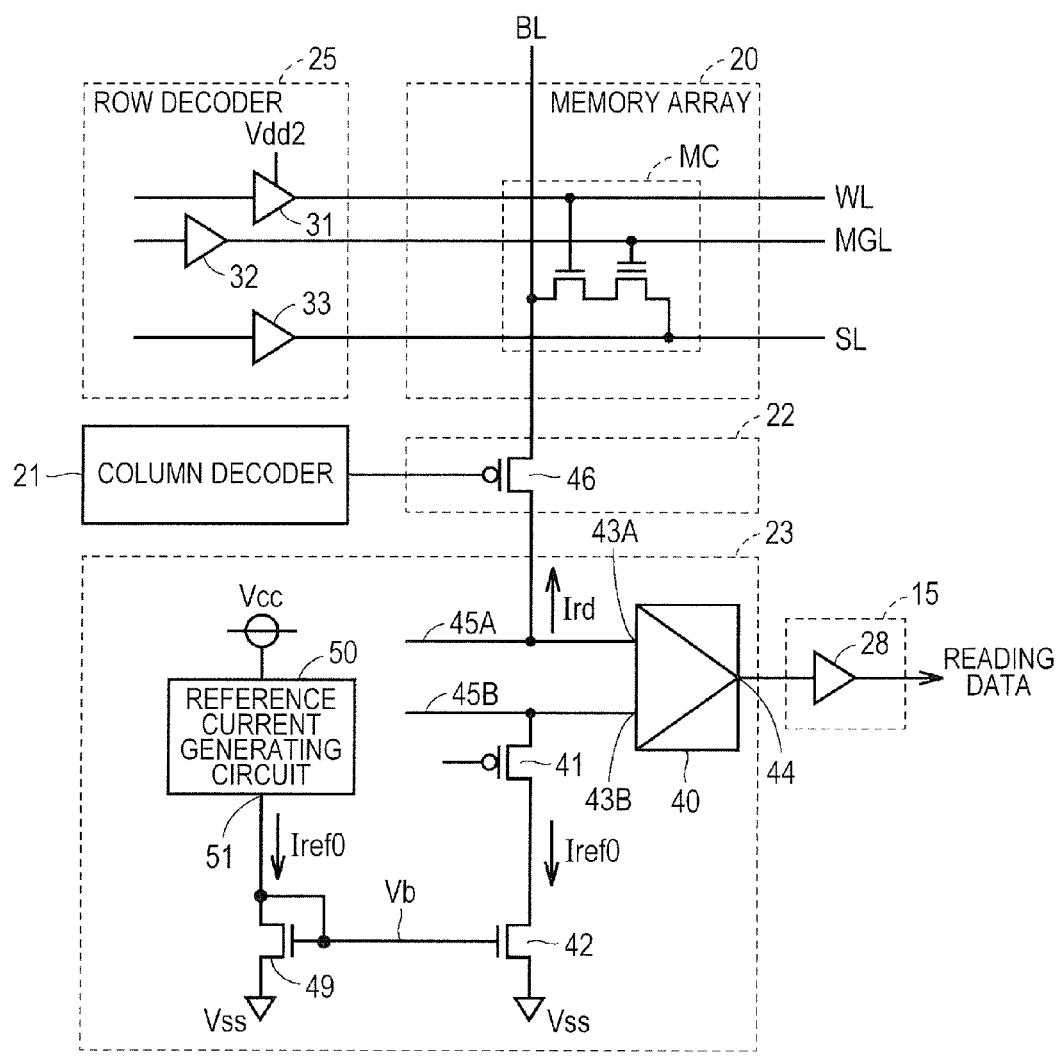
FIG. 6 is a circuit diagram showing a specifically showing a configuration example of the reading circuit 23 shown in FIG. 5.

FIG. 6 is a circuit diagram specifically showing a configuration example of the reading circuit 23 shown in FIG. 5. FIG. 6 also shows the memory array 20, the column decoder 21, the column selecting circuit 22, and the row decoder 25 of FIG. 5.

Referring to FIG. 6, the reading circuit 23 includes a sense amplifier 40, a PMOS (P-channel Metal Oxide Semiconductor) transistor 46, the reference current generating circuit 50, and NMOS (N-channel MOS) transistors 42 and 49.

The sense amplifier 40 includes a first input node 43A, a second input node 43B, and an output node 44. The sense amplifier 40 amplifies a difference between a current passing through a first output signal line 45A coupled to the first input node 43A and a current passing through a second output signal line 45B coupled to the second input node 43B, and then the sense amplifier 40 outputs the comparison result of the current values from the output node 44. The output signal of the sense amplifier 40 is transmitted to an output buffer 28 provided in the high-speed access port (HACSP) 15. The output buffer 28 is coupled to a data bus HBUS-D of the high-speed bus HBUS. The output buffer 28 outputs the output of the sense amplifier 40 to the CPU 2 or the DMAC 3 of FIG. 1 through the high-speed data bus HBUS-D.

The column selecting circuit 22 includes a plurality of switching PMOS transistors (FIG. 6 shows a representative PMOS transistor 46). The PMOS transistors are turned on or off according to the decoding result of the column decoder 21. Thus, the memory cell MC to be read is coupled to the output signal line 45A to be read. At this point, a reading current Ird from the input node 43A of the sense amplifier 40 sequentially passes through the output signal line 45A, the column selecting circuit 22 (PMOS transistor 46), the corresponding bit line BL, and the memory cell MC to be read and then reaches the corresponding source line SL.

The reference current generating circuit 50 generates the reference current and supplies the current to the source of the NMOS transistor 49. The reference current generating circuit 50 is a characteristic part of the semiconductor device according to the first embodiment and will be specifically discussed below with reference to FIGS. 9 to 17.

The drain of the NMOS transistor 49 is coupled to an output node 51 of the reference current generating circuit 50 and the source of the NMOS transistor 49 is coupled to a ground node (hereinafter will be simply referred to as "ground node Vss") that receives a ground voltage Vss.

The NMOS transistor 42 includes a current mirror with the NMOS transistor 49. Specifically, in FIG. 6, the source of the NMOS transistor 42 is coupled to the ground node Vss and the gate of the NMOS transistor 42 is coupled to the source and drain of the NMOS transistor 49. Thus, a reference current Iref0 outputted from the output node 51 of the reference current generating circuit 50 is copied to the NMOS transistor 42 according to the mirror ratio of a current mirror. In FIG. 6, the mirror ratio is 1 and thus a current equal to the reference current Iref0 passing through the NMOS transistor 49 also flows to the NMOS transistor 42.

The drain of the NMOS transistor 42 is coupled to the second output signal line 45B via the PMOS transistor 41 used as a switch. Thus, during data reading, the reference current Iref0 from the input node 43B of the sense amplifier 40 sequentially passes through the output signal line 45B, the PMOS transistor 41 in an on state, and the NMOS transistor 42 for a constant current source, and then the reference current Iref0 reaches the ground node Vss.

In this configuration, the reference current generating circuit 50 acts as a current source that outputs the reference current Iref0 from the output node 51. Alternatively, the reference current generating circuit 50 may act as a current sink that absorbs the reference current Iref0 from the output node 51. In this case, the NMOS transistors 42 and 49 in FIG. 6 are not necessary. The reference current generating circuit 50 is coupled between the drain of the PMOS transistor 41 and the ground node Vss.

The Reading Margin of a Reference Current Reading Method

An operation margin (reading margin) during data reading according to the reference current reading method will be described below.

Figure 7:
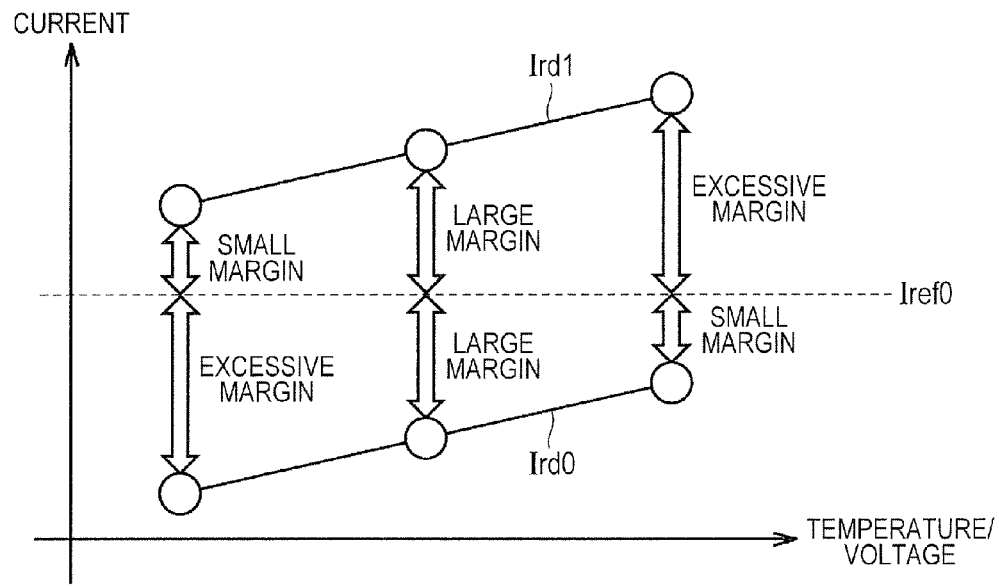
FIG. 7 is an explanatory drawing of a reading margin if a reference current Iref0 is set at a constant value regardless of a temperature and a power supply voltage.

FIG. 7 is an explanatory drawing of a reading margin if the reference current Iref0 is set at a constant value regardless of a temperature and a power supply voltage. Referring to FIG. 7, the reading current (that is, a cell current passing through the memory cell) is set at Ird0 if the memory cell data is "0", whereas the reading current is set at Ird1 if the memory cell data is "1". If the reference current Iref0 is set between the reading current Ird0 in the case of cell data "0" and the reading current Ird1 in the case of cell data "1", data can be normally read. If the reference current Iref0 is a median of the reading currents Ird0 and Ird1, the reading margin has an optimum value. In this case, the cell data "0" and the cell data "1" can be separately read with reliability.

However, as shown in FIG. 7, the reading currents Ird0 and Ird1 passing through the memory cell MC during data reading fluctuate with temperatures and power voltages. Thus, if the reading current Iref0 is kept constant regardless of the temperature and the power supply voltage, the reading margin is reduced or excessively increased.

Figure 8:
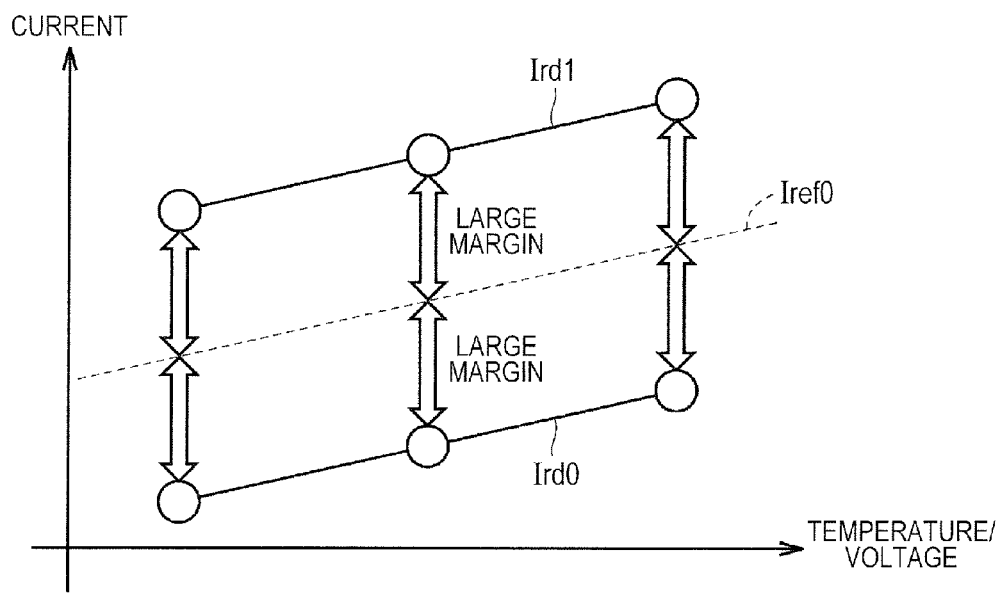
FIG. 8 is an explanatory drawing showing a reading margin if the reference current Iref0 is changed according to the temperature and the power supply voltage.

FIG. 8 is an explanatory drawing showing a reading margin if the reference current Iref0 is changed according to the temperature and the power supply voltage. As shown in FIG. 8, the magnitude of the reference current Iref0 is changed according to the dependence of a drain current, which passes through the memory cell, on temperatures and power supply voltages (in other words, the reference current Iref0 depends on temperatures and power supply voltages as the reading currents Ird0 and Ird1). This can keep a constant reading margin.

Problems in the Generation of the Reference Current

Figure 9A:
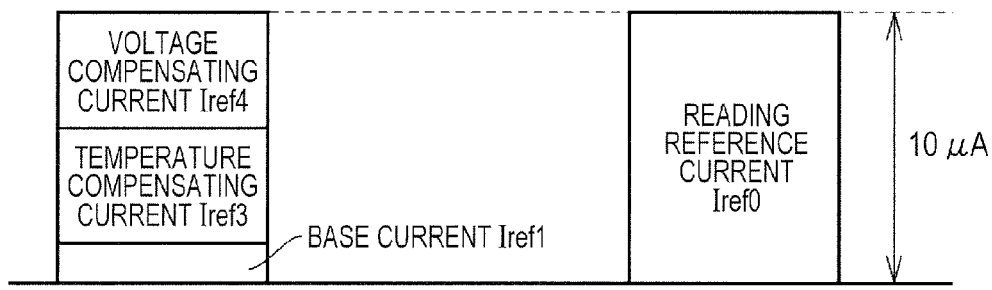
FIGS. 9A and 9B are explanatory drawings showing a trimming method of a reference current and the problem of the method according to a comparative example.
Figure 9B:
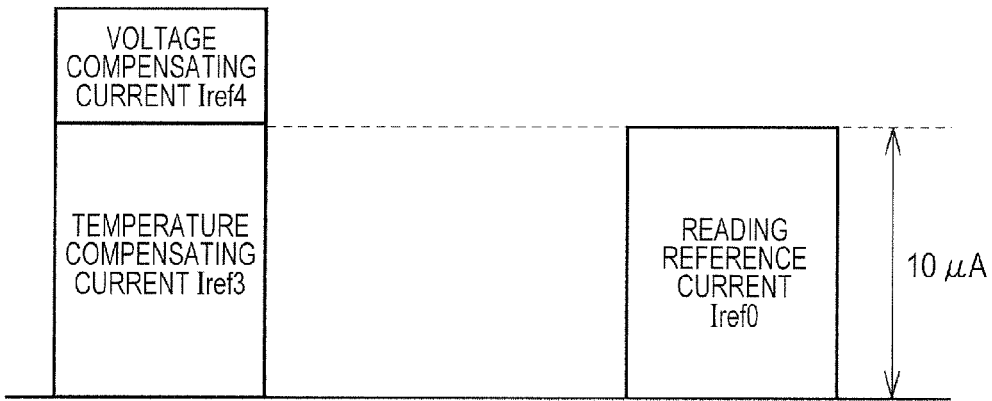

FIGS. 9A and 9B are explanatory drawings showing a trimming method of the reference current and the problem of the method according to a comparative example. Referring to FIG. 9A, as the comparison example of the present embodiment, a temperature compensating current Iref3 having temperature dependence and a voltage compensating current Iref4 having voltage dependence are added to a base current Iref1 that does not depend on temperatures and power supply voltages, forming the configuration of the reference current Iref0 (i.e., Iref0=Iref1+Iref3+Iref4).

In this case, in order to increase the temperature dependence (specifically, in order to increase a change in reference current relative to a temperature change), the ratio of the temperature compensating current Iref3 in the reference current is increased. In order to increase the dependence on power supply voltage (specifically, in order to increase a change in reference current relative to a change of the power supply voltage), the ratio of the voltage compensating current Iref4 in the reference current is increased. Moreover, the base current Iref1 that can be trimmed is set in consideration of the influence of variations in the manufacturing process. For example, in FIG. 9A, the magnitude of the base current Iref1 is adjusted such that the reading reference current Iref0 has a desired magnitude (e.g., 10 μA).

However, as shown in FIG. 9B, a problem may occur if at least one of the temperature compensating current Iref3 and the voltage compensating current Iref4 is increased by variations in the manufacturing process more than expected. In this case, even if the base current Iref1 is trimmed to 0, the reading reference current Iref0 may not be set at a desired magnitude (e.g., 10 μA).

For example, assuming that the desired set value of the reading reference current is 10 μA, the measured value of the temperature compensating current is 3 μA, and the measured value of the voltage compensating current is 3 μA, the base current to 4 μA is adjusted so as to set the reading reference current at the desired value. If the temperature compensating current and the voltage compensating current are doubled by process variations, the temperature compensating current and the voltage compensating current are set at 6 μA, which exceeds a desired reading current of 10 μA. In this case, even if the base current is reduced to 0 μA, the total current is 12 μA, which precludes trimming.

The reference current generating circuit 50 of the present embodiment provides a solution to this problem. The reference current generating circuit 50 will be specifically described below with reference to the accompanying drawings.

Figure 10:
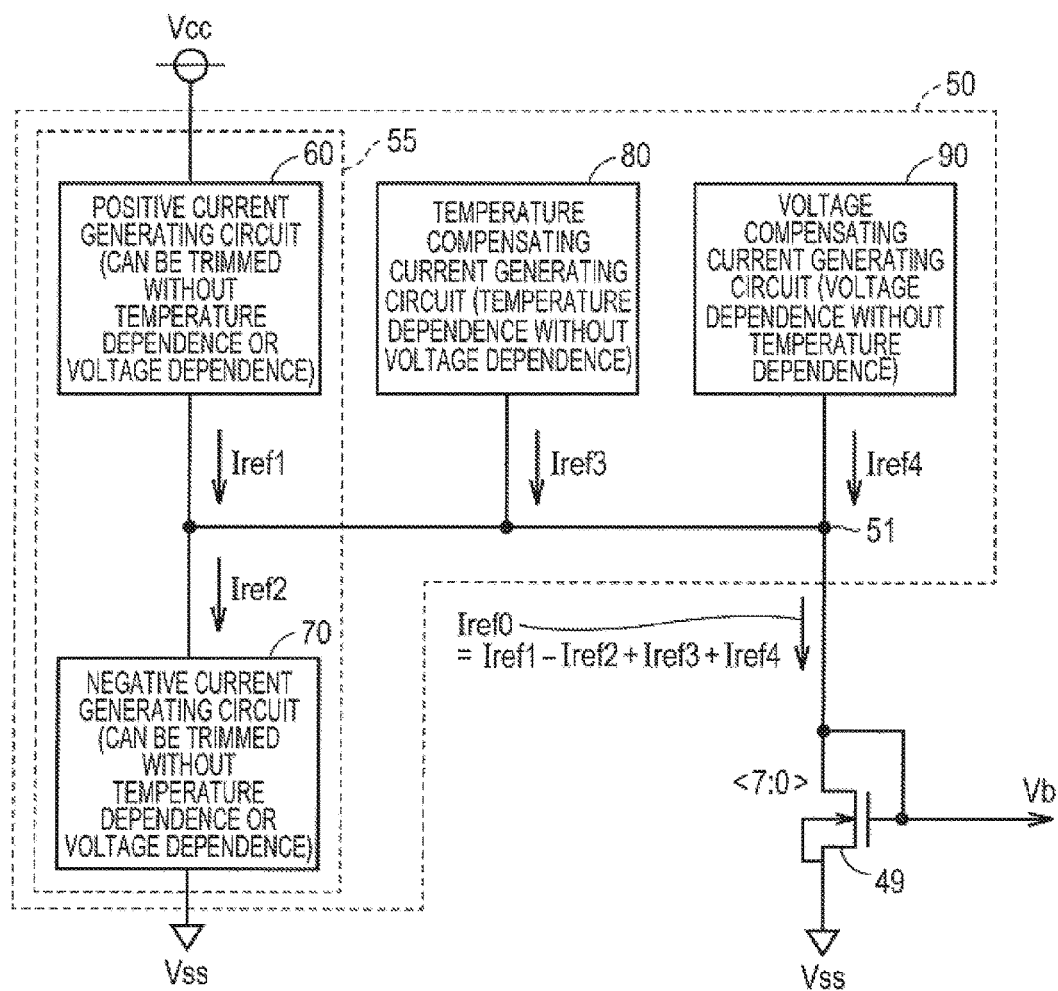
FIG. 10 is a block diagram showing the schematic configuration of a reference current generating circuit in the semiconductor device of the first embodiment.

The Schematic Configuration and Effect of the Reference Current Generating Circuit FIG. 10 is a block diagram showing the schematic configuration of the reference current generating circuit in the semiconductor device of the first embodiment. Referring to FIG. 10, the reference current generating circuit 50 includes a base current generating circuit 55, a temperature-compensating current generating circuit 80, and a voltage-compensating current generating circuit 90.

The base current generating circuit 55 includes a positive current generating circuit 60 for generating the positive current Iref1 (also referred to as "first base current") that can be trimmed and a negative current generating circuit 70 for generating a negative current Iref2 (also referred to as "second base current"). In FIG. 10, the positive current is a current applied in a direction flowing from the output node 51 of the reference current generating circuit 50 while the negative current is a current applied in a direction flowing to the output node 51. In other words, the positive current Iref1 and the negative current Iref2 are opposite to each other. The positive current Iref1 and the negative current Iref2 are generated so as to hardly depend on temperatures and voltages.

The temperature-compensating current generating circuit 80 generates the temperature compensating current Iref3 in the same direction as the positive current Iref1 (that is, in a direction flowing from the output node 51). The temperature compensating current Iref3 is generated with substantially the same temperature dependence as a drain current passing through the memory cell but hardly depends on a power supply voltage. Thus, the temperature compensating current Iref3 more greatly depends on temperatures than the positive current Iref1 and the negative current Iref2.

The voltage-compensating current generating circuit 90 generates the voltage compensating current Iref4 in the same direction as the positive current Iref1 (that is, in a direction flowing from the output node 51). The voltage compensating current Iref4 has substantially the same dependence on power supply voltages as a drain current passing through the memory cell but hardly depends on temperatures. Thus, the voltage compensating current Iref4 more greatly depends on power supply voltages than the positive current Iref1 and the negative current Iref2.

The reference current generating circuit 50 combines the positive current Iref1, the negative current Iref2, the temperature compensating current Iref3, and the voltage compensating current Iref4 so as to generate the reference current Iref0, and then outputs the generated reference current Iref0 from the output node 51. Specifically, the reference current Iref0 is determined as follows:

$$Iref0 = Iref1 - Iref2 + Iref3 + Iref4 \quad (1)$$

The generated reference current Iref0 passes through the NMOS transistor 49 so as to apply the reference current Iref0 to the NMOS transistor 42 that includes, as shown in FIG. 6, a current mirror with the NMOS transistor 49.

In FIG. 10, the NMOS transistors 49 are arranged in parallel according to a necessary amount of current. An expression <7:0> in FIG. 10 indicates that the 0-th to seventh NMOS transistors 49 identical in size are coupled in parallel.

In the first embodiment, as shown in FIG. 10, the reference current generating circuit is configured as a current source. Specifically, the positive current generating circuit, the temperature-compensating current generating circuit, and the voltage-compensating current generating circuit are configured as current sources while the negative current generating circuit is configured as a current sink. Unlike in the example of FIG. 10, the reference current generating circuit can be configured as a current sink. In this case, the positive current generating circuit, the temperature-compensating current generating circuit, and the voltage-compensating current generating circuit are configured as current sinks while the negative current generating circuit is configured as a current source.

The effect of the reference current generating circuit configured as shown in FIG. 10 will be described below. FIG. 11 is an explanatory drawing showing trimming of the reference current generated by the reference current generating circuit of FIG. 10.

Figure 11A:
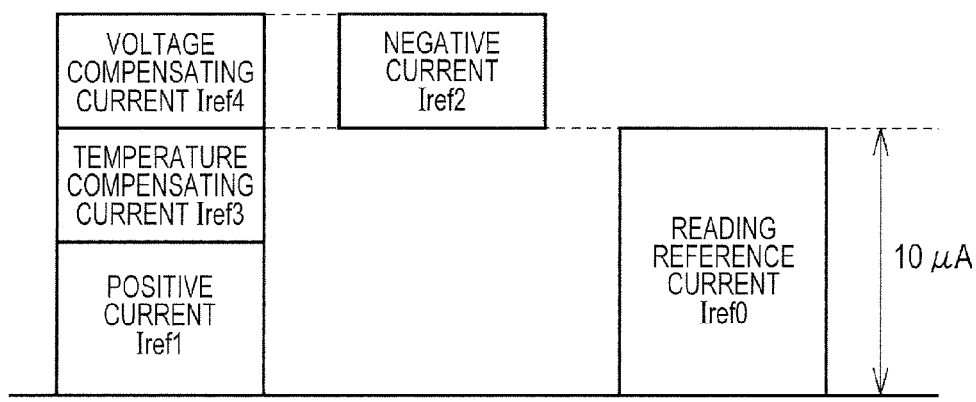
FIGS. 11A and 11B are explanatory drawings showing trimming of the reference current generated by the reference current generating circuit shown in FIG. 10.
Figure 11B:
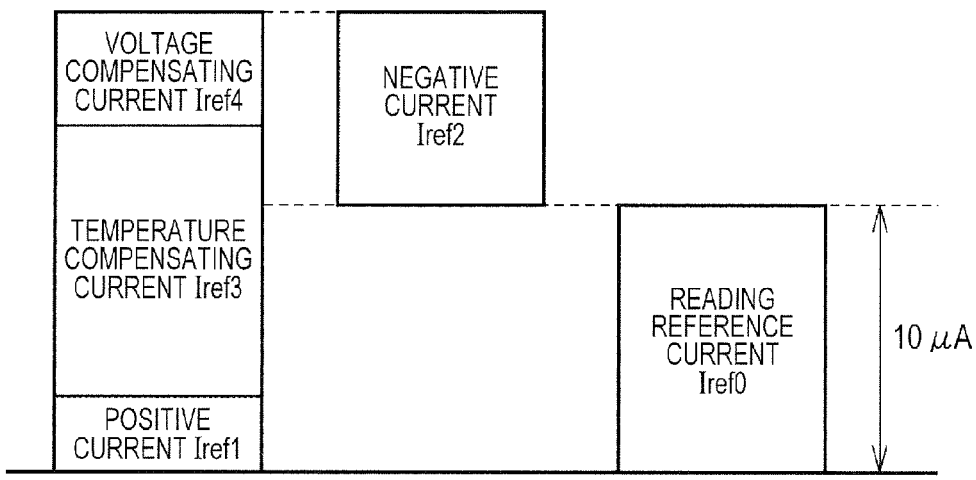

Unlike in FIG. 9A, in the present embodiment of FIG. 11A, if the sum of the positive current Iref1, the temperature compensating current Iref3, and the voltage compensating current Iref4 exceeds a desired value (e.g., 10 μA), the magnitude of the negative current Iref2 is adjusted so as to set the reference current Iref0 at the desired value. Furthermore, at least one of the temperature compensating current Iref3 and the voltage compensating current Iref4 is increased. Thus, even if only the positive current Iref1 cannot be trimmed to a desired value (FIG. 9B), the positive current Iref1 can be trimmed by increasing the absolute value of the negative current Iref2 as shown in FIG. 11B. For example, if the target value of the reading reference current Iref0 is set at 10 μA, the measured value of the temperature compensating current Iref3 is 6 μA and the measured value of the voltage compensating current Iref4 is 6 μA. In this case, the positive current Iref1 is set at 0 μA and the negative current Iref2 is set at −2 μA, thereby adjusting the reference current Iref0 to a target value of 10 μA.

According to the reference current generating circuit 50 of FIG. 10, the negative current generating circuit 70 is provided to extend the range of the reference current that can be trimmed. Specific configuration examples of the current generating circuits 60, 70, 80, and 90 in FIG. 10 will be described below.

The Configuration Example of the Positive Current Generating Circuit

Figure 12:
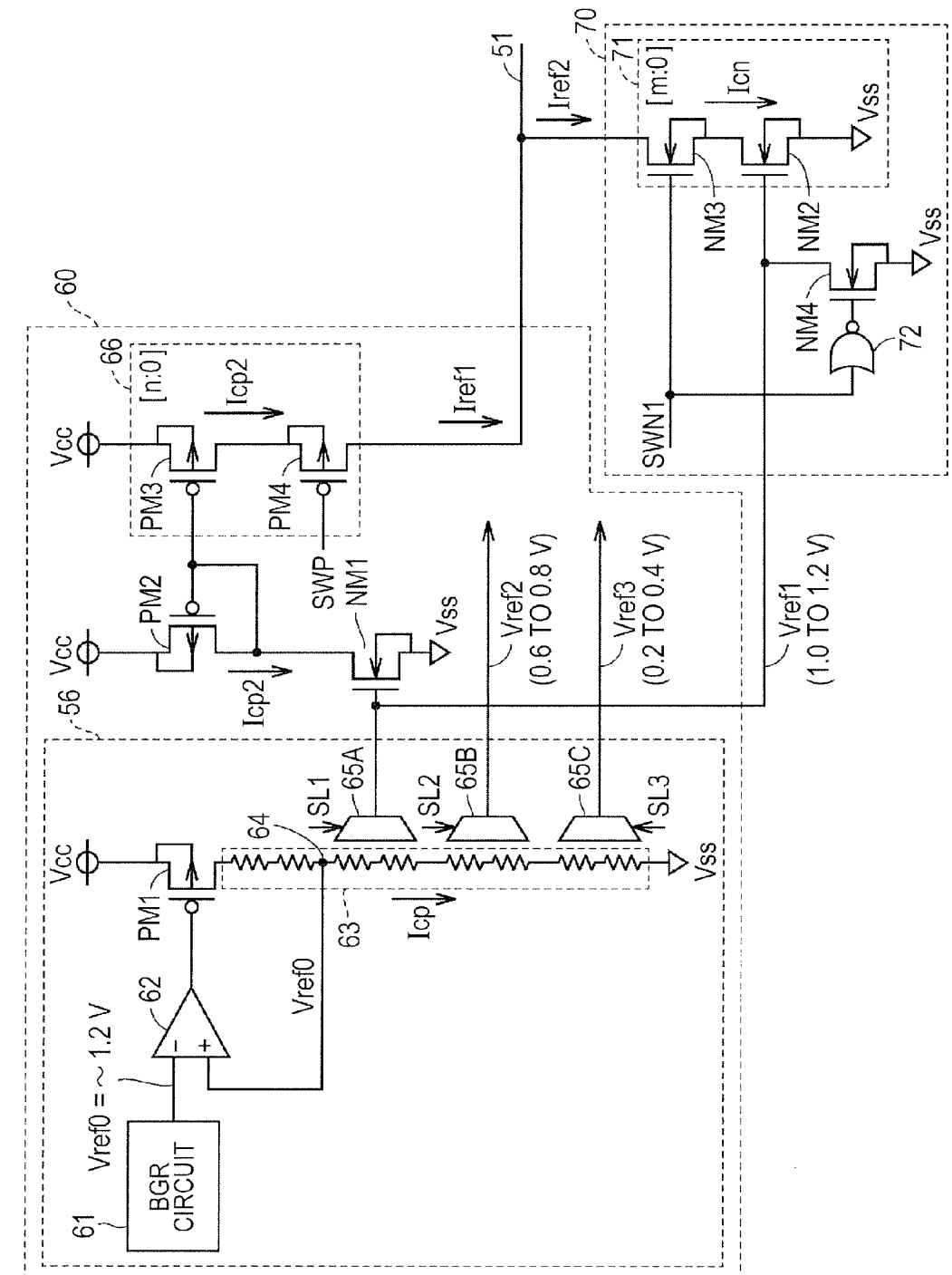
FIG. 12 is a circuit diagram showing a configuration example of a positive current generating circuit 60 and a negative current generating circuit 70 that are shown in FIG. 10.

FIG. 12 is a circuit diagram showing a configuration example of the positive current generating circuit 60 and the negative current generating circuit 70 that are shown in FIG. 10. Referring to FIG. 12, the positive current generating circuit 60 includes a reference power supply part 56, an NMOS transistor NM1, a PMOS transistor PM2, and a positive current adjusting part 66. The reference power supply part 56 generates a reference current Icp and reference voltages Vref1, Vref2, and Vref3 that hardly depend on temperatures and power supply voltages. The positive current adjusting part 66 generates the trimmed positive current Iref1 according to the reference voltage Vref1. In this specification, the reference power supply part 56 included in the positive current generating circuit 60 for illustration may be a separate constituent element of the positive current generating circuit 60.

Specifically, the reference power supply part 56 includes a BGR (Band Gap Reference) circuit 61, a differential amplifier 62, a PMOS transistor PM1, a voltage divider circuit 63, and multiplexers 65A, 65B, and 65C. The constituent elements will be sequentially discussed below.

The BGR circuit 61 generates the power supply voltage and a reference voltage Vref0 that hardly depends on temperatures. The BGR circuit 61 may have a known circuit configuration. The magnitude of the generated reference voltage Vref0 is about 1.2 V. The reference voltage Vref0 outputted from the BGR circuit 61 is inputted to the inverting input terminal (negative terminal) of the differential amplifier 62.

The source of the PMOS transistor PM1 is coupled to a power supply node (hereinafter simply referred to as "power supply node Vcc") that receives the power supply voltage Vcc. The output voltage of the differential amplifier 62 is inputted to the gate of the PMOS transistor PM1. The voltage divider circuit 63 is coupled between the drain of the PMOS transistor PM1 and the ground node Vss.

The voltage divider circuit 63 includes a plurality of resistance elements coupled in series between the drain of the PMOS transistor PM1 and the ground node Vss. In order to apply the current Icp to the PMOS transistor PM1 while hardly depending on temperatures and power supply voltages, it is desirable that the resistance values of the resistance elements hardly depend on temperatures. The resistance elements are made of, for example, polysilicon. A voltage from a voltage dividing node 64 of the voltage divider circuit 63 is inputted to the non-inverting input terminal (positive terminal) of the differential amplifier 62.

The multiplexers 65A, 65B, and 65C select the voltages of the coupling nodes of the resistance elements, which include the voltage divider circuit 63 (that is, divided voltages generated by the voltage divider circuit 63), in response to selecting signals SL1, SL2, and SL3. The divided voltage (reference voltage Vref1) selected by the first multiplexer 65A is supplied to the gate of the NMOS transistor NM1 and the negative current generating circuit 70. The divided voltage (reference voltage Vref2) selected by the second multiplexer 65B is supplied to the temperature-compensating current generating circuit 80. The divided voltage (reference voltage Vref) selected by the third multiplexer 65C is supplied to the voltage-compensating current generating circuit 90.

The values of the selecting signals SL1, SL2, and SL3 are determined by experiment so as to be set at the desired values of the reference voltages Vref1, Vref2, and Vref3 during, for example, manufacturing of the semiconductor device. The determined values of the selecting signals SL1, SL2, and SL3 are stored in, for example, the system region of the memory module 6. The values are then written into the register in the control circuit 27 of FIG. 5 by the CPU at the startup of the semiconductor device. The selecting signals SL1, SL2, and SL3 are outputted from the register.

The operations of the reference power supply part 56 will be described below. The differential amplifier 62 adjusts the current of the PMOS transistor PM1 so as to reduce a voltage difference between the voltage of the voltage dividing node 64 of the voltage divider circuit 63 and the reference voltage Vref0. Thus, the voltage of the voltage dividing node 64 of the voltage divider circuit 63 is substantially equal to the reference voltage Vref0 outputted from the BGR circuit 61. This keeps constant the divided voltages (the reference voltages Vref1, Vref2, and Vref3) selected by the multiplexers 65A, 65B, and 65C, without depending on power supply voltages or temperatures. Moreover, the resistance elements including the voltage divider circuit 63 have resistance values that hardly depend on temperatures, keeping constant the current Icp flowing to the voltage divider circuit 63 through the PMOS transistor PM1, without depending on power supply voltages and temperatures.

As described above, the reference power supply part 56 generates the reference current Icp and the reference voltages Vref1, Vref2, and Vref3 that hardly depend on temperatures and power supply voltages (the reference current Icp is not used in the circuit of FIG. 12 but is used in a modification of the first embodiment and second and third embodiments, which will be described later).

Figure 14:
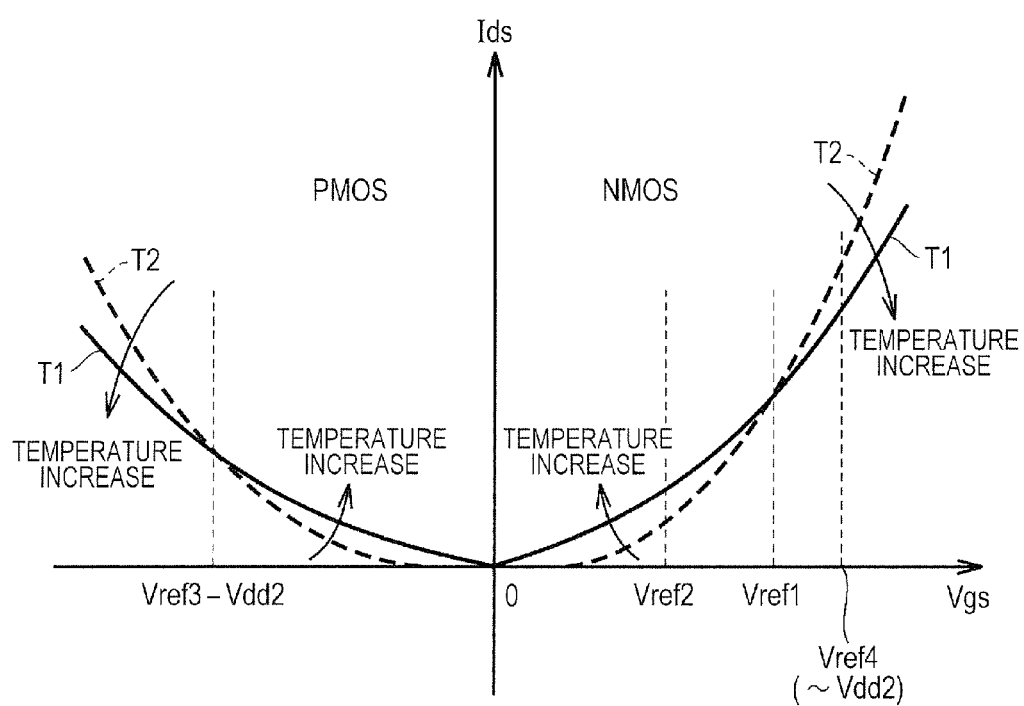
FIG. 14 shows the temperature dependence of the current-voltage characteristics of a MOS transistor.

The divided voltage (Vref1) generated by the voltage divider circuit 63 of the reference power supply part 56 is inputted to the gate of the NMOS transistor NM1. The reference voltage Vref1 is set such that the current Icp2 passing through the NMOS transistor NM1 hardly depends on temperatures. Referring to FIG. 14, a specific setting method of the reference voltage Vref1 will be described later. Furthermore, the reference voltage Vref1 is a divided voltage of the output voltage Vref0 of the BGR circuit 61 and thus hardly depends on temperatures and power supply voltages. Thus, a voltage across the gate and source of the NMOS transistor NM1 is kept at a constant value regardless of the temperature and the power supply voltage. In this way, the current Icp2 passing through the NMOS transistor NM1 is kept at a constant value that hardly depends on temperatures and power supply voltages.

The source of the PMOS transistor PM2 is coupled to the power supply node Vcc and the drain of the PMOS transistor PM2 is coupled to the drain of the NMOS transistor NM1. Thus, the current Icp2 also passes through the PMOS transistor PM2. Furthermore, the gate and drain of the PMOS transistor PM2 are coupled to the gate of a PMOS transistor PM3, which will be described later, and thus the PMOS transistors PM2 and PM3 include a current mirror.

The configuration of the positive current adjusting part 66 will be discussed below. The positive current adjusting part 66 includes the PMOS transistors PM3 and a plurality of PMOS transistors PM4 for the respective PMOS transistors PM3.

The source of the PMOS transistor PM3 is coupled to the power supply node Vcc shared by the PMOS transistor PM2. The gate of the PMOS transistor PM3 is coupled to the gate and drain of the PMOS transistor PM2. The PMOS transistor PM3 includes a current mirror circuit with the PMOS transistor PM2, which outputs the reference current Icp2 from the drain of the PMOS transistor PM3 with a mirror ratio of 1.

The source of the PMOS transistor PM4 is coupled to the drain of the corresponding PMOS transistor PM3. The drain of the PMOS transistor PM4 is coupled to a common node (a node 67 in FIG. 13). The gate of the PMOS transistor PM4 receives a signal of the corresponding bit out of switching signals SWP of n+1 bits. The PMOS transistor PM4 is turned on or off in response to the switching signal SWP, thereby adjusting the magnitude of the generated positive current Iref1. Specifically, the value of the positive current Iref1 is equal to a value obtained by multiplying the value of the reference current Icp2 by the number of PMOS transistors PM4 in an on state.

Figure 13:
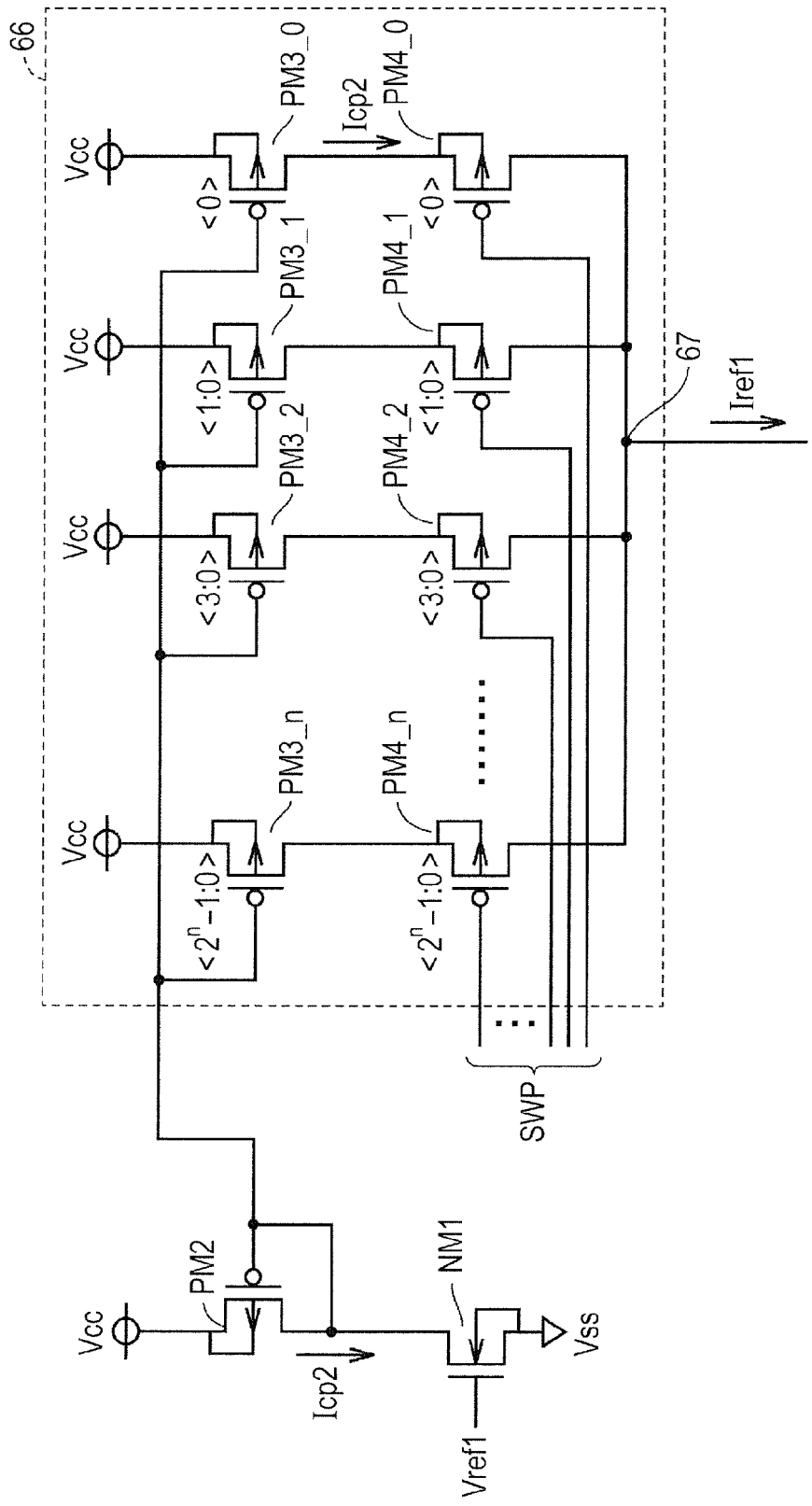
FIG. 13 is a circuit diagram more specifically showing the configuration of a positive current adjusting part 66 in FIG. 12.

FIG. 13 is a circuit diagram more specifically showing the configuration of the positive current adjusting part 66 in FIG. 12. Referring to FIG. 13, the PMOS transistors PM3 and PM4 including the positive current adjusting part 66 are each provided for any one of the n+1 bits of the switching signal SWP.

Specifically, a PMOS transistor PM3_0 and a PMOS transistor PM4_0 are provided for the least significant bit (0-th bit), $2^n$ PMOS transistors PM3_n and $2^n$ PMOS transistors PM4_n are provided for the most significant bit (n-th bit), and typically, $2^i$ PMOS transistors PM3_i and $2^i$ PMOS transistors PM4_i are provided for the i-th bit (i=0 to n). Consequently, the positive current adjusting part 66 includes the $2^{n+1}-1$ PMOS transistors PM3 and the $2^{n+1}-1$ NMOS transistors PM4. An expression [n:0] in FIG. 12 indicates that the number of PMOS transistors PM3 and PM4 corresponds to the switching signals of n+1 bits.

If the i-th bit (i=0 to n) of the switching signal SWP is "0" (corresponding to a low level (L level) in this specification), the corresponding $2^i$ PMOS transistors PM4_i are all turned on. Thus, a current passing through the two corresponding $2^i$ PMOS transistors PM3_i is used as the positive current Iref1. Conversely, if the i-th bit (i=0 to n) of the switching signal SWP is "1" (corresponding to a high level (H level) in this specification), the corresponding $2^i$ PMOS transistors PM4_i are all turned off. Thus, the corresponding $2^i$ PMOS transistors PM3_i are not used for generating the positive current Iref1.

The PMOS transistor PM4 is turned on or off according to the bit value of the switching signal SWP, allowing the positive current adjusting part 66 to generate the positive current Iref1 up to $(2^{n+1}-1) \times Icp2$ for each current Icp.

The value of the switching signal SWP is determined by experiment so as to set at the optimum magnitude of the positive current Iref1 during, for example, manufacturing of the semiconductor device. The determined value of the switching signal SWP is stored in, for example, the system region of the memory module 6. The value is then written into the register in the control circuit 27 of FIG. 5 by the CPU at the startup of the semiconductor device. The switching signal SWP is outputted from the register.

A Modification of the Positive Current Generating Circuit

Referring to FIG. 12, a modification of the positive current generating circuit 60 will be described below. In the positive current generating circuit 60, the output of the differential amplifier 62 can be directly coupled to the gate of the PMOS transistor PM3 without the NMOS transistor NM1 and the PMOS transistor PM2. In this case, the source of the PMOS transistor PM3 is coupled to the power supply node Vcc shared by the PMOS transistor PM1. The gate of the PMOS transistor PM3 receives the output voltage of the differential amplifier 62. The reference current Icp is outputted from the drain of the PMOS transistor PM3 like the PMOS transistor PM1. Thus, the value of the positive current Iref1 is equal to a value obtained by multiplying the value of the reference current Icp by the number of PMOS transistors PM4 in an on state. Specifically, the PMOS transistor PM4 is turned on or off according to the bit value of the switching signal SWP, allowing the positive current adjusting part 66 to generate the positive current Iref1 up to $(2^{n+1}-1) \times Icp2$ for each current Icp.

A Configuration Example of the Negative Current Generating Circuit

Referring to FIG. 12, the negative current generating circuit 70 includes a negative current adjusting part 71 that generates the negative current Iref2 trimmed based on the reference voltage Vref1, an NMOS transistor NM4, and a NOR gate 72.

The negative current adjusting part 71 is configured as the positive current adjusting part 66. In the negative current adjusting part 71, however, the PMOS transistor is replaced with the NMOS transistor. Specifically, the negative current adjusting part 71 includes $2^{m+1}-1$ NMOS transistors NM2 and $2^{m+1}-1$ NMOS transistors NM3 for the respective NMOS transistors NM2.

The source of the NMOS transistor NM2 is coupled to the ground node Vss. The gate of the NMOS transistor NM2 receives a divided voltage (reference voltage Vref1) generated by the voltage divider circuit 63. The reference voltage Vref1 is set such that a current Icn passing through the NMOS transistor NM2 hardly depends on temperatures. Referring to FIG. 14, a specific setting method of the reference voltage Vref1 will be described later. Furthermore, the reference voltage Vref1 is a divided voltage of the output voltage Vref0 of the BGR circuit 61 and thus hardly depends on temperatures and power supply voltages. Thus, a voltage across the gate and source of the NMOS transistor NM2 is kept at a constant value regardless of the temperature and the power supply voltage. In this way, the current Icn passing through the NMOS transistor NM2 is kept at a constant value that hardly depends on temperatures and power supply voltages.

The source of the NMOS transistor NM3 is coupled to the drain of the corresponding NMOS transistor NM2. The drain of the NMOS transistor NM3 is coupled to the common node (output node 51). The gate of the NMOS transistor NM3 receives a signal of the corresponding bit out of switching signals SWN1 of m+1 bits. The NMOS transistor NM3 is turned on or off in response to the switching signal SWN1, thereby adjusting the magnitude of the generated negative current Iref2. Specifically, the value of the negative current Iref2 is equal to a value obtained by multiplying the value of the current Icn, which passes through the single NMOS transistor NM2, by the number of NMOS transistors NM3 in an on state. In other words, the negative current adjusting part 71 can generate the negative current Iref2 up to $(2^{m+1}-1) \times Icn$ for each current Icn.

The NMOS transistor NM4 is shared by the NMOS transistors NM2 and is coupled between the gate of the NMOS transistor NM2 and the ground node Vss. The NOR gate 72 outputs the NOR operation results of all bit values of the switching signal SWN1 to the gate of the NMOS transistor NM4. Thus, if all the bits of the switching signal SWN1 are set at "0", that is, if the negative current Iref2 is set at 0, the NMOS transistor NM4 is turned on. This fixes the gate voltage of the NMOS transistor NM2 at the ground voltage Vss, preventing a current from passing through the NMOS transistor NM2.

FIG. 14 shows the temperature dependence of the current-voltage characteristics of a MOS transistor. In FIG. 14, the horizontal axis indicates a gate to source voltage Vgs and the vertical axis indicates a drain current Id. The right side of FIG. 14 (the gate to source voltage Vgs is positive) shows the characteristics of the NMOS transistor while the left side of FIG. 14 (the gate to source voltage Vgs is negative). A temperature T1 is higher than a temperature T2.

As shown in FIG. 14, if the absolute value of the gate to source voltage Vgs is smaller than a threshold value, the drain current Id shows positive dependence relative to a temperature, whereas if the gate to source voltage Vgs is larger than the threshold value, the drain current Id shows negative dependence relative to a temperature. In the case of the threshold value, that is, a point where the drain current has a temperature coefficient of 0 is referred to as a zero temperature coefficient point. The reference voltage Vref1 in FIG. 12 is set equal to the gate to source voltage Vgs at the zero temperature coefficient point of the NMOS transistors NM1 and NM2. This can substantially eliminate the temperature dependence of the current Icn passing through the NMOS transistor NM1 and the NMOS transistor NM2 in FIG. 12.

Figure 15:
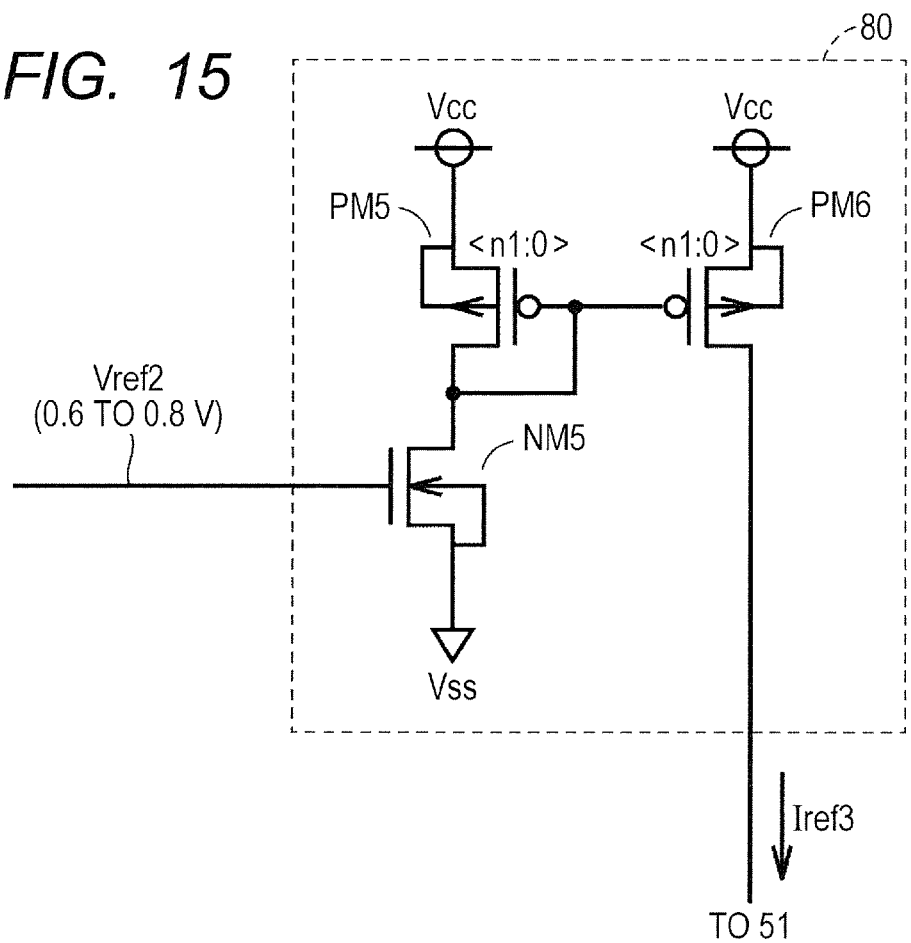
FIG. 15 is a circuit diagram showing a configuration example of a temperature-compensating current generating circuit.

A Configuration Example of the Temperature-Compensating Positive Current Generating Circuit FIG. 15 is a circuit diagram showing a configuration example of the temperature-compensating current generating circuit. Referring to FIG. 15, the temperature-compensating current generating circuit 80 includes an NMOS transistor NM5 serving as a constant current source and PMOS transistors PM5 and PM6.

The source of the NMOS transistor NM5 is coupled to the ground node Vss. The gate of the NMOS transistor NM5 receives a divided voltage (reference voltage Vref2) generated by the voltage divider circuit 63. The reference voltage Vref2 is set such that a current passing through the NMOS transistor NM5 has the same temperature dependence as a reading current passing through the memory cell. Specifically, as shown in FIG. 13, the reference voltage Vref2 is set at the gate to source voltage Vgs in a region where the drain current Id has positive temperature dependence. Since the reference voltage Vref3 is kept at a constant value regardless of the power supply voltage, the gate to source voltage of the NMOS transistor NM5 does not depend on the power supply voltage. Thus, a current passing through the NMOS transistor NM5 hardly depends on the power supply voltage.

The source of the PMOS transistor PM5 is coupled to the power supply node Vcc and the drain of the PMOS transistor is coupled to the drain of the NMOS transistor NM5. The source of the PMOS transistor PM6 is coupled to the power supply node Vcc and the gate of the PMOS transistor PM6 is coupled to the gate and drain of the PMOS transistor PM5. The PMOS transistors PM5 and PM6 (n1 PMOS transistors in FIG. 15) are provided in parallel according to the amount of current of the temperature compensating current Iref3.

In this way, the PMOS transistors PM5 and PM6 include a current mirror. A current passing through the NMOS transistor NM5 is copied according to a mirror ratio and then is outputted as the temperature compensating current Iref3 from the drain of the PMOS transistor PM6.

Figure 16:
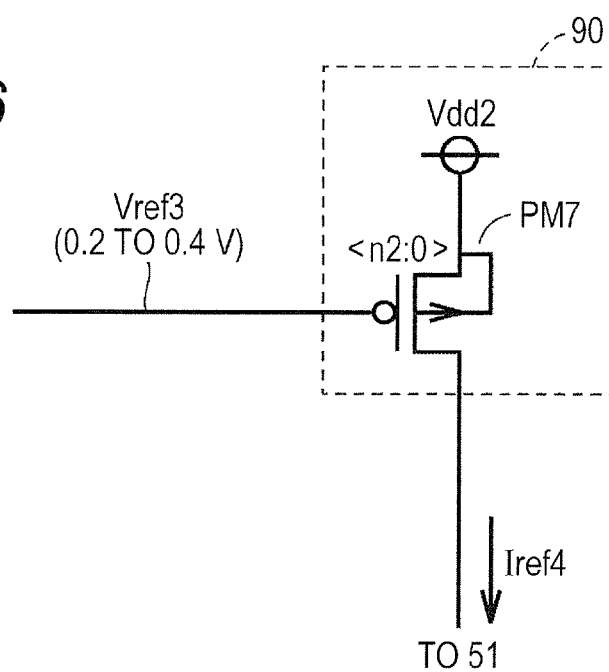
FIG. 16 is a circuit diagram showing a configuration example of a voltage-compensating current generating circuit.

A Configuration Example of the Voltage-Compensating Current Generating Circuit FIG. 16 is a circuit diagram showing a configuration example of the voltage-compensating current generating circuit. Referring to FIG. 16, the voltage-compensating current generating circuit 90 includes PMOS transistors PM7 that receives a power supply voltage Vdd2 (different from the power supply voltage Vcc) from the source and receives the reference voltage Vref3 from the gate. The PMOS transistors PM7 (n2 PMOS transistors in FIG. 16) are provided in parallel according to the magnitude of the generated voltage compensating current Iref4. The voltage compensating current Iref4 is outputted from the common node near the drains of the PMOS transistors PM7.

As shown in FIG. 6, the power supply voltage Vdd2 is supplied to the control gate of the memory cell MC to be read, from the word-line driver 31 through the word line WL during data reading. Thus, a drain current (the voltage compensating current Iref4) passing through the PMOS transistor PM7 depends on power supply voltages as a reading current passing through the memory cell MC during data reading.

The reference voltage Vref3 is set such that a drain current passing through the PMOS transistor PM7 does not depend on temperatures, that is, the gate to source voltage of the PMOS transistor PM7 reaches the zero temperature coefficient point of the PMOS transistor PM7. Specifically, as shown in FIG. 13, a value obtained by subtracting the power supply voltage Vdd2 from the reference voltage Vref3 is set equal the gate to source voltage at the zero temperature coefficient point of the PMOS transistor PM7.

A Modification of the Voltage-Compensating Current Generating Circuit

Figure 17:
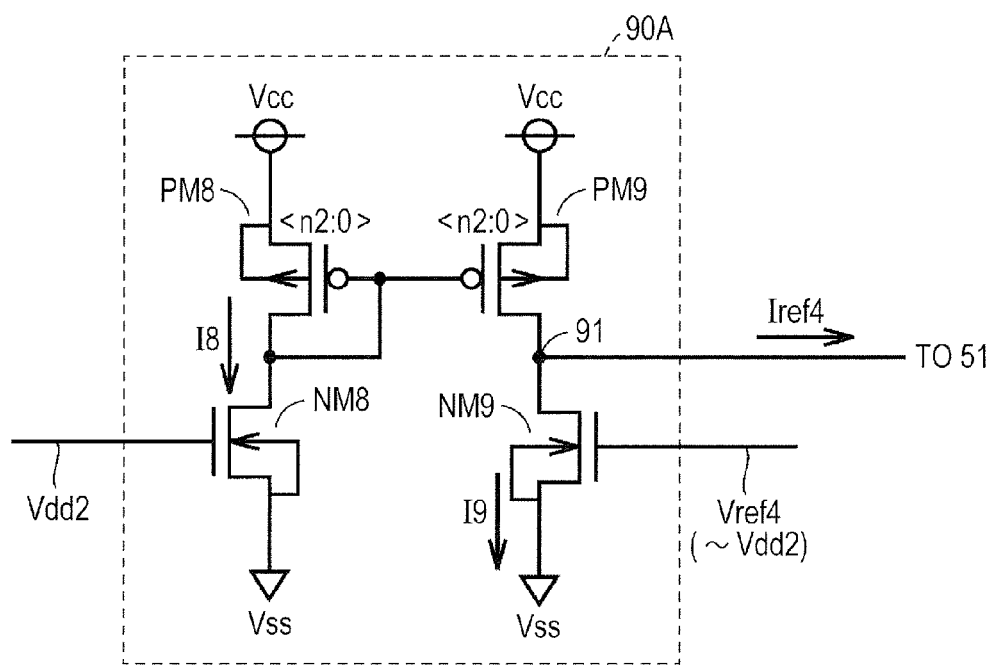
FIG. 17 is a circuit diagram showing a modification of the voltage-compensating current generating circuit.

FIG. 17 is a circuit diagram showing a modification of the voltage-compensating current generating circuit. Referring to FIG. 17, the voltage-compensating current generating circuit 90A includes an NMOS transistor NM8 serving as a constant current source, PMOS transistors PM8 and PM9 that include a current mirror circuit, and an NMOS transistor NM9 serving as a constant current source. The PMOS transistor PM8 and the NMOS transistor NM8 are sequentially coupled in series between the power supply node Vcc and the ground node Vss. The PMOS transistor PM9 and the NMOS transistor NM9 are sequentially coupled in series between the power supply node Vcc and the ground node Vss. A coupling node 91 between the PMOS transistor PM9 and the NMOS transistor NM9 is coupled to the output node 51 of the reference current generating circuit 50.

The power supply voltage Vdd2 is applied to the gate of the NMOS transistor NM8. The power supply voltage Vdd2 (e.g., 1.5 V as shown in FIG. 2) is supplied to the control gate of the memory cell MC to be read, from the word-line driver 31 through the word line WL during data reading. Thus, a drain current I8 passing through the NMOS transistor NM8 depends on power supply voltages as a reading current passing through the memory cell MC during data reading. The drain current I8 also depends on temperatures. The generated drain current I8 is copied as a drain current of the PMOS transistor PM9.

The NMOS transistor NM9 is provided to eliminate the temperature dependence of the drain current I8. Specifically, the gate of the NMOS transistor NM9 receives a divided voltage (reference voltage Vref4) generated by the voltage divider circuit 63 shown in FIG. 12 (a multiplexer for drawing the reference voltage Vref4 is not shown in FIG. 12). The reference voltage Vref4 is set equal to the design value (e.g., 1.5 V) of the power supply voltage Vdd2. Since the reference voltage Vref4 does not depend on power supply voltages, a drain current I9 passing through the NMOS transistor NM9 does not depend on power supply voltages. The drain current I9 has substantially the same temperature dependence as the drain current I8 passing through the NMOS transistor NM8.

Finally, the voltage compensating current Iref4 outputted from the coupling node 91 is equal to a value obtained by subtracting the drain current I9 from the drain current I8. As a result, the voltage compensating current Iref4 depends on power supply voltages almost like a reading current passing through the memory cell to be read but hardly depends on temperatures.

The Effect of the First Embodiment

Figure 18:
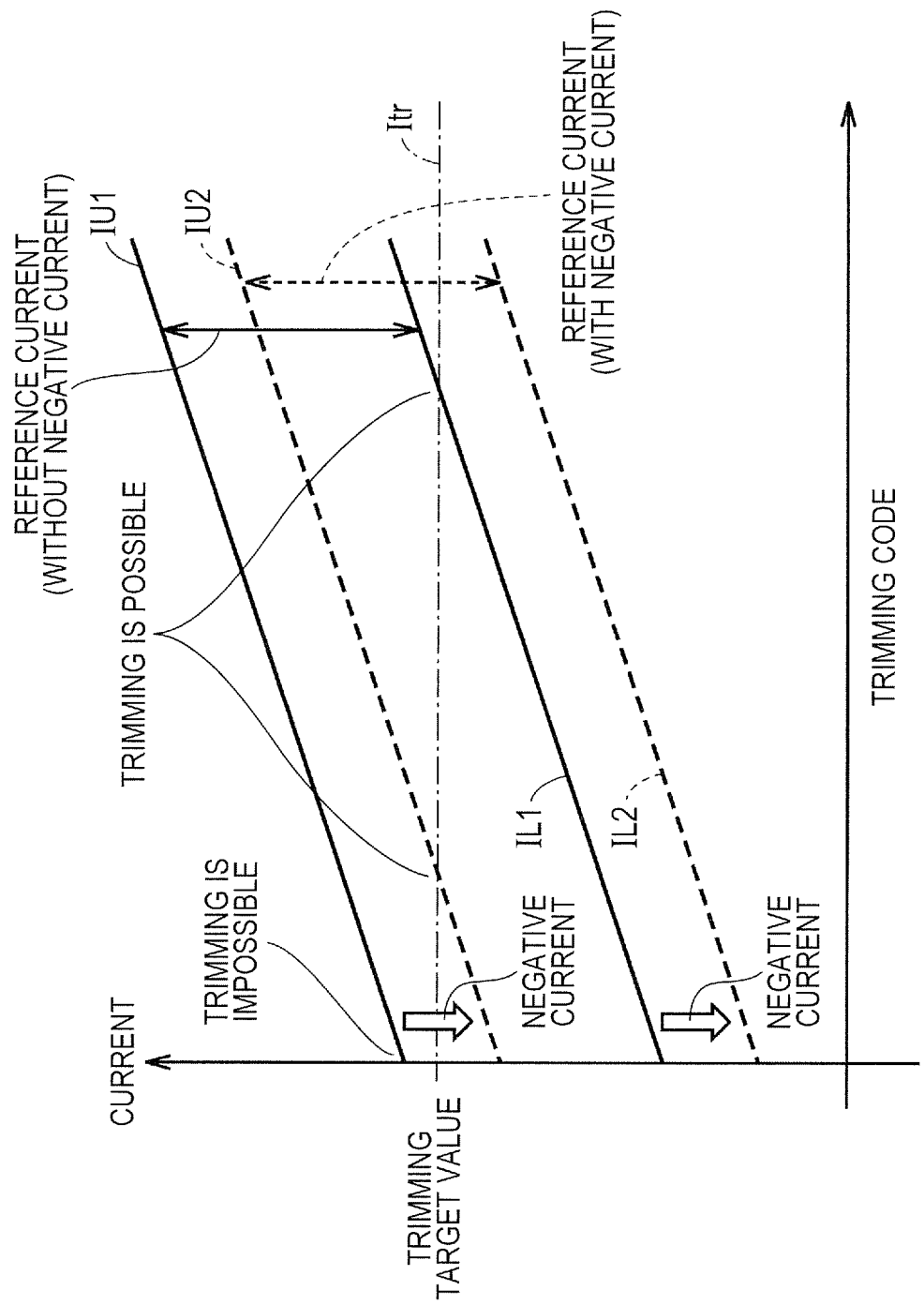
FIG. 18 schematically shows the relationship between the reference current and a trimming code according to the first embodiment.

The effect of the first embodiment will be described below. FIG. 18 schematically shows the relationship between the reference current and a trimming code. The trimming code indicates the value of the switching signal SWP in FIG. 12.

Referring to FIG. 18, solid lines in the graph show the relationship between the reference current and the trimming code in the absence of a negative current. The magnitude of the reference current can be changed according to the trimming code but is actually affected by variations in the manufacturing process so as to change from a maximum value IU1 to a minimum value IL1. When the magnitude of the current is changed to the maximum IU1, a change of the trimming code cannot adjust the magnitude of the reference current to a trimming target value Itr.

Broken lines in the graph show the relationship between the reference current and the trimming code in the presence of the negative current. Also in this case, the actual magnitude of the reference current is changed from the maximum value IU2 to the minimum value IL2 by variations in the manufacturing process. Also in the case where the magnitude of the reference current is changed to the maximum value IU2 using the negative current, the magnitude of the reference current can be adjusted to the trimming target value Itr by changing the trimming code.

Thus, the reference current generating circuit of the semiconductor device according to the first embodiment can extend the range of the reference current that can be trimmed.

Second Embodiment

In the first embodiment, the negative current Iref2 is generated according to the reference voltage Vref1 by means of the NMOS transistor serving as a constant current source, whereas in a second embodiment, a negative current Iref2 is generated according to a reference current Icp by means of a PMOS transistor serving as a constant current source. A positive current generating circuit and a negative current generating circuit will be specifically described below with reference to the accompanying drawings with reference to the accompanying drawings. A temperature-compensating current generating circuit and a voltage-compensating current generating circuit are identical to those of the first embodiment and thus the explanation thereof will not be repeated.

Figure 19:
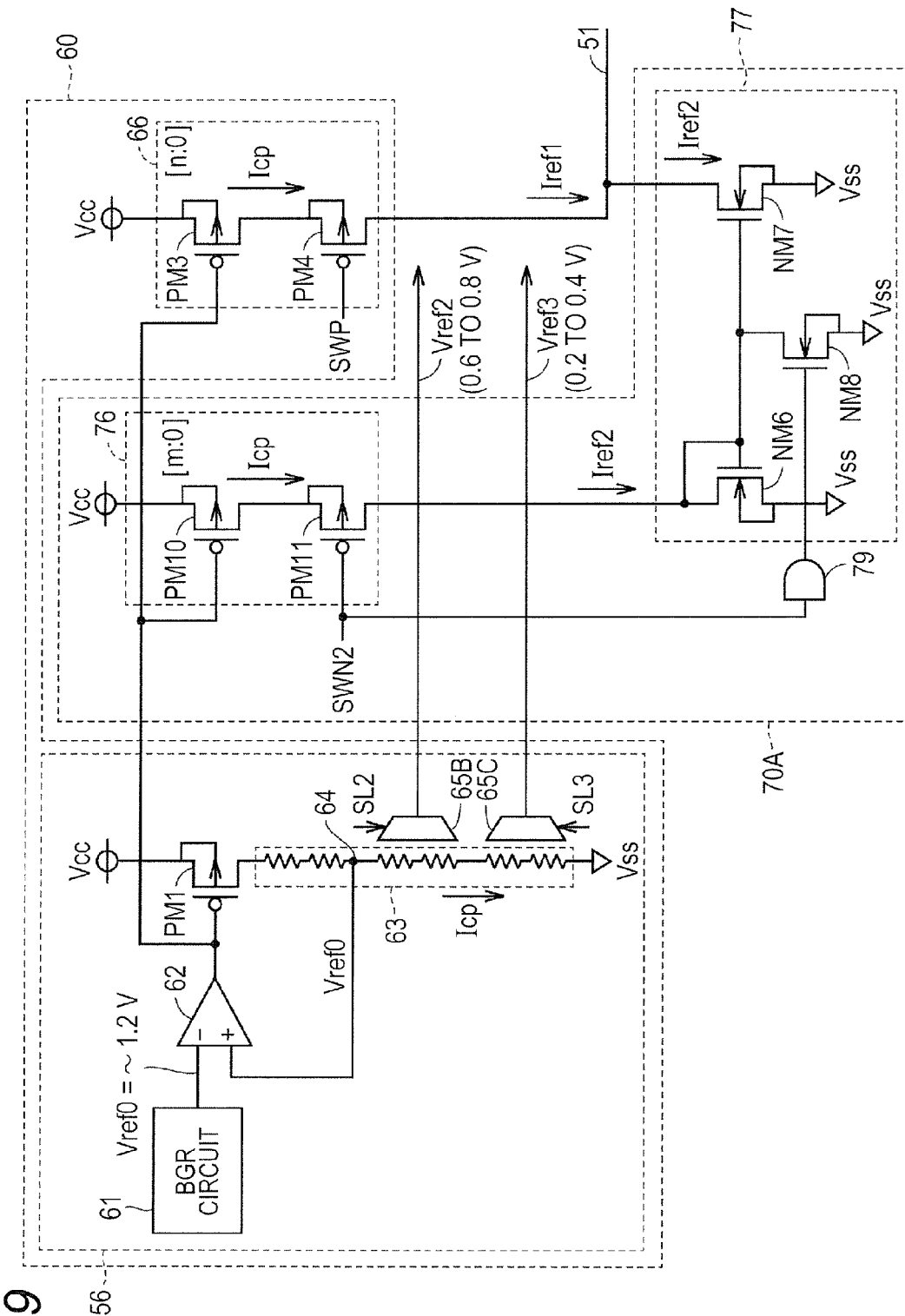
FIG. 19 is a circuit diagram showing the configurations of a positive current generating circuit and a negative current generating circuit in a semiconductor device according to a second embodiment.

The Configurations of the Positive Current Generating Circuit and the Negative Current Generating Circuit FIG. 19 is a circuit diagram showing the configurations of the positive current generating circuit and the negative current generating circuit in a semiconductor device according to the second embodiment. A positive current generating circuit 60 is identical in configuration to the positive current generating circuit 60 shown in FIG. 12 and includes a reference power supply part 56 and a positive current adjusting part 66. The multiplexer 65A, the PMOS transistor PM2, and the NMOS transistor NM1 in FIG. 12 are not provided.

A negative current generating circuit 70A includes a negative current adjusting part 76, a current mirror circuit 77, and an AND gate 79. The negative current adjusting part 76 is has a similar configuration to the positive current adjusting part 66 and generates a negative current Iref2 trimmed based on the reference current Icp. The direction of the negative current Iref2 is reversed from that of the positive current Iref1 by copying the generated negative current Iref2 through the current mirror circuit 77 including NMOS transistors NM6 and NM7.

Specifically, the negative current adjusting part 76 includes $2^{m+1}-1$ PMOS transistors PM10 and $2^{m+1}-1$ PMOS transistors PM11 for the respective PMOS transistors PM10. The source of the PMOS transistor PM10 is coupled to a power supply node Vcc. The gate of the PMOS transistor PM10 receives the output voltage of a differential amplifier 62. Thus, a constant drain current Icp passes through the PMOS transistors PM10 regardless of the power supply voltage and the temperature.

The source of the PMOS transistor PM11 is coupled to the drain of the corresponding PMOS transistor PM10. The drain of the PMOS transistor PM11 is coupled to a common node. The gate of the PMOS transistor PM11 receives a signal of the corresponding bit out of switching signals SWN2 of m+1 bits. The PMOS transistor PM11 is turned on or off in response to the switching signal SWN2, thereby adjusting the magnitude of the generated negative current Iref2. Specifically, the value of the negative current Iref2 is equal to a value obtained by multiplying the value of the current Icn, which passes through the single PMOS transistor PM10, by the number of PMOS transistors PM11 in an on state. In other words, the negative current adjusting part 76 can generate the negative current Iref2 up to $(2^{m+1}-1) \times$ Icn for each current Icp.

The current mirror circuit 77 includes the NMOS transistors NM6 and NM7, and an NMOS transistor NM8. The drain of the NMOS transistor NM6 is coupled to the drain of the PMOS transistor PM11 including the negative current adjusting part 76. The source of the NMOS transistor NM6 is coupled to a ground node Vss. The drain of the NMOS transistor NM7 is coupled to an output node 51 of a reference current generating circuit 50 and the source of the NMOS transistor NM7 is coupled to the ground node Vss. The gate of the NMOS transistor NM7 is coupled to the gate and drain of the NMOS transistor NM6.

With this configuration, the NMOS transistors NM6 and NM7 include a current mirror and the copied negative current Iref2 passes through the NMOS transistor NM7. The negative current Iref2 flows into the reference current generating circuit 50 from the output node 51 and thus is opposite in direction to the positive current Iref1 that passes out of the reference current generating circuit 50 from the output node 51.

The drain of the NMOS transistor NM8 is coupled to the gates of the NMOS transistors NM6 and NM7 while the source of the NMOS transistor NM8 is coupled to the ground node Vss. The AND gate 79 outputs the AND operation results of all bit values of the switching signal SWN2 to the gate of the NMOS transistor NM8. Thus, if all the bits of the switching signal SWN2 are set at "1", that is, if the negative current Iref2 is set at 0, the NMOS transistor NM8 is turned on. This fixes the gate voltages of the NMOS transistors NM6 and NM7 at the ground voltage Vss, preventing a current from passing through the current mirror circuit 77.

The Effect of the Second Embodiment

The second embodiment can obtain substantially the same effect as the first embodiment. Specifically, the negative current Iref2 is contained in a reference current Iref0, extending the range of the reference current Iref0 that can be trimmed.

Third Embodiment

In a third embodiment, a negative current generating circuit 70B does not include the negative current adjusting parts 71 and 76 of the first and second embodiments. The negative current generating circuit 70B changes the path of a positive current Iref1 generated by a positive current generating circuit 60, a negative current Iref2 is generated. A positive current generating circuit and the negative current generating circuit will be specifically described below with reference to the accompanying drawings. A temperature-compensating current generating circuit and a voltage-compensating current generating circuit are identical to those of the first embodiment and thus the explanation thereof will not be repeated.

Figure 20:
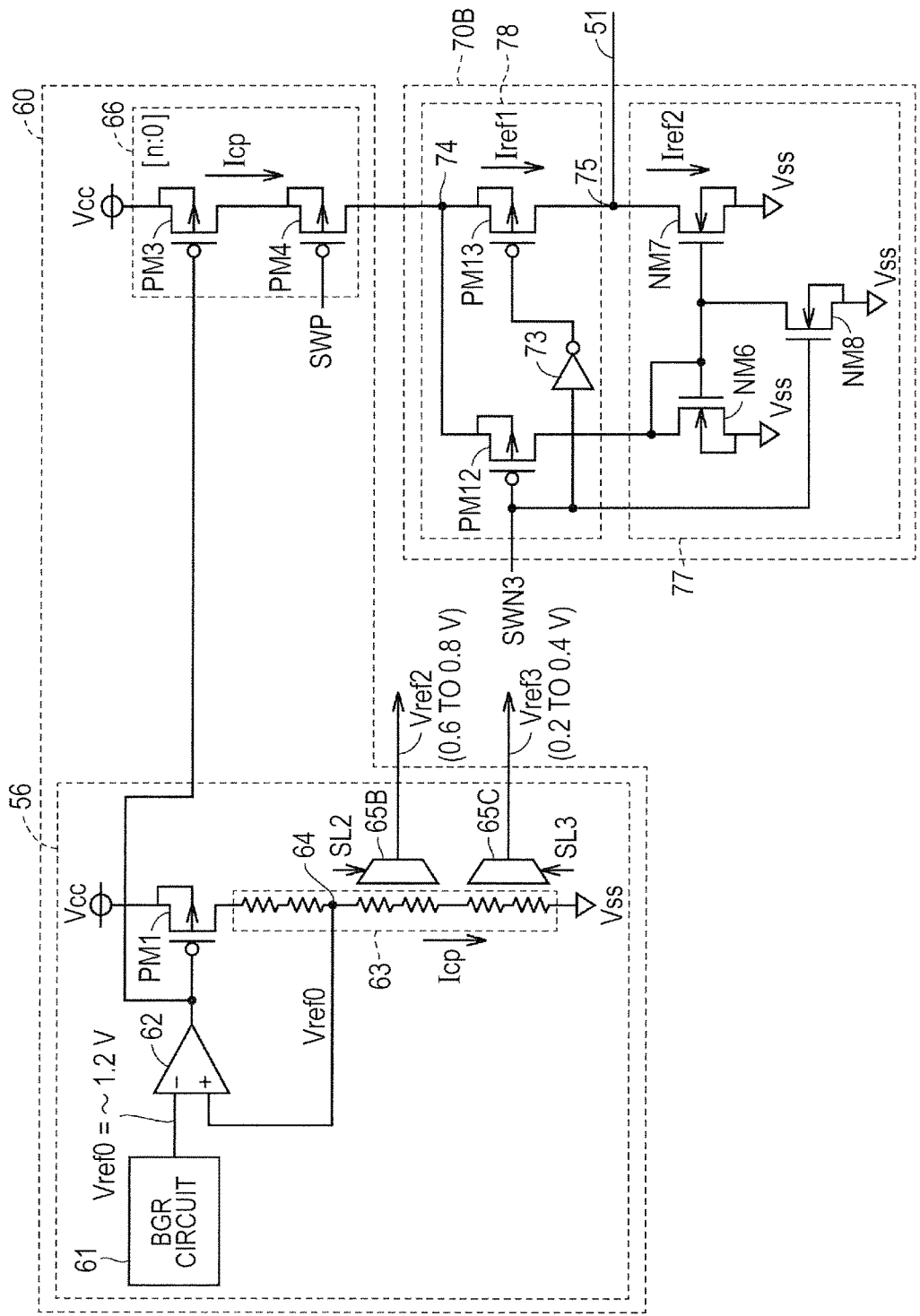
FIG. 20 is a circuit diagram showing the configurations of a positive current generating circuit and a negative current generating circuit in a semiconductor device according to a third embodiment.

The Configurations of the Positive Current Generating Circuit and the Negative Current Generating Circuit FIG. 20 is a circuit diagram showing the configurations of the positive current generating circuit and the negative current generating circuit in a semiconductor device according to the third embodiment. Referring to FIG. 20, the positive current generating circuit 60 includes a reference power supply part 56 and a positive current adjusting part 66 and has a similar configuration to the positive current generating circuit 60 shown in FIG. 19, and thus the explanation of the positive current generating circuit 60 will not be repeated. The negative current generating circuit 70B includes a switch circuit 78 and a current mirror circuit 77.

Specifically, the switch circuit 78 includes PMOS transistors PM12 and PM13 and an inverter 73. The sources of the PMOS transistors PM12 and PM13 are couled to anode 74 that is coupled to the drains of PMOS transistors PM4 of the positive current adjusting part 66. The gate of the PMOS transistor PM12 receives a switching signal SWN3. The gate of the PMOS transistor PM13 receives a signal inverted from the logic level of the switching signal SWN3 by the inverter 73.

In the configuration of the switch circuit, if the switching signal SWN3 is at an H level ("1" in FIG. 20), the PMOS transistor PM13 is turned on and the PMOS transistor PM12 is turned off. This applies the positive current Iref1 to the PMOS transistor PM13. If the switching signal SWN3 is at an L level ("0"), the PMOS transistor PM13 is turned off and the PMOS transistor PM12 is turned on. This applies the positive current Iref1 to the PMOS transistor PM12.

The current mirror circuit 77 is configured as in FIG. 19. In FIG. 20, the drain of an NMOS transistor NM6 is coupled to the drain of the PMOS transistor PM12 while the drain of an NMOS transistor NM7 is coupled to the drain of the PMOS transistor PM13. A coupling node 75 between the PMOS transistor PM13 and the NMOS transistor NM7 is coupled to an output node 51 of a reference current generating circuit 50. The gate of an NMOS transistor NM8 receives the switching signal SWN3. Thus, if the switching signal SWN3 is set at "1" (H level), the NMOS transistors NM6 and NM7 including a current mirror are turned off.

According to the configuration of the negative current generating circuit 70B, if the switching signal SWN3 is at "1" (H level), the positive current Iref1 generated by the positive current adjusting part 66 passes through the PMOS transistor PM13 and is outputted to the outside of the reference current generating circuit 50 from the output node 51. In this case, a current does not pass through the current mirror circuit 77. If the switching signal SWN3 is at "0" (L level), the positive current Iref1 generated by the positive current adjusting part 66 passes through the PMOS transistor PM12 so as to be guided to the current mirror circuit 77. The positive current Iref1 is copied by the current mirror circuit 77 so as to pass through the NMOS transistor NM7 as the negative current Iref. The negative current Iref2 flows into the reference current generating circuit 50 from the output node 51 and thus is opposite indirection to the positive current Iref1.

As described above, the third embodiment completely switches the generation of the positive current Iref1 and the generation of the negative current Iref2 in response to the switching signal SWN3.

The Effect of the Third Embodiment

The effect of the third embodiment will be described below. FIG. 21 schematically shows the relationship between a reference current and a trimming code. The trimming code indicates the value of the switching signal SWP in FIG. 20.

Referring to FIG. 21, solid lines in the graph show the relationship between the reference current and the trimming code in the case where only the positive current is used. The magnitude of the reference current can be changed according to the trimming code but is actually affected by variations in the manufacturing process so as to change from a maximum value IU1 to a minimum value IL1. In the example of FIG. 21, when the magnitude of the current is changed to the maximum IU1, a change of the trimming code cannot adjust the magnitude of the reference current to a trimming target value Itr.

Broken lines in the graph show the relationship between the reference current and the trimming code if a base current is switched from a positive current to a negative current. Also in this case, the actual magnitude of the reference current is changed from the maximum value IU2 to the minimum value IL2 by variations in the manufacturing process. A characteristic point is, as shown in FIG. 21, that the trimming code and the reference current have a symmetric relation unlike before switching to a negative current. This can further extend the range of trimming more than in the first and second embodiments.

In the third embodiment, the negative current generating circuit 70B does not include the negative current adjusting parts 71 and 76 that are provided in the first and second embodiments. Thus, in the third embodiment, the reference current generating circuit can have a smaller area than in the first and second embodiments.

Modification

According to the first to third embodiments, MOS transistors are used as circuit examples but the transistor type is not particularly limited. For example, bipolar transistors or other kinds of FETs (Field Effect Transistors) may be used. In this specification, NPN bipolar devices and N-channel FETs are referred to as N-type transistors and PNP bipolar devices and P-channel FETs are referred to as P-type transistors.

The inventions made by the present inventors were specifically described according to the embodiments. Undoubtedly, the present invention is not limited to the embodiments and can be changed in various ways without departing from the scope of the invention.

What is claimed is:

1. A semiconductor device comprising:
    a reference current generating circuit that generates a reference current,
    the reference current generating circuit including:
    a first base current generating circuit that generates a first base current capable of being trimmed;
    a second base current generating circuit that generates a second base current capable of being trimmed, the second base current flowing opposite to the first base current,
    a temperature-compensating current generating circuit that generates a temperature compensating current flowing in a same direction as the first base current with higher temperature dependence than the first and second base currents; and
    a voltage-compensating current generating circuit that generates a voltage compensating current that flows in a same direction as the first base current with higher dependence on a power supply voltage than the first and second base currents,
    the reference current containing the first base current, the second base current, the temperature compensating current, and the voltage compensating current.

2. The semiconductor device according to claim 1, further comprising:
    a memory array including a plurality of memory cells; and
    a sense amplifier that reads data stored in the memory cell to be read, the data being read by comparing the reference current and a current passing through the memory cell to be read.

3. The semiconductor device according to claim 2, wherein the reference current generating circuit further includes:
    a differential amplifier having a first input terminal that receives a reference voltage generated by a bandgap reference circuit;
    a first P-type transistor having a first main electrode that receives a first power supply voltage and a control electrode that receives an output voltage of the differential amplifier; and
    a voltage divider circuit coupled between a second main electrode of the first P-type transistor and a ground node for supplying a ground voltage, the voltage divider circuit generating a first divided voltage to be supplied to a second input terminal of the differential amplifier,
    the first base current generating circuit generates the first base current according to the output voltage of the differential amplifier, and
    the second base current generating circuit, the temperature-compensating current generating circuit, and the voltage-compensating current generating circuit generate the second base current, the temperature compensating current, and the voltage compensating current, respectively, according to a divided voltage generated by the voltage divider circuit.

4. The semiconductor device according to claim 3, wherein the first base current generating circuit includes at least one second P-type transistor having a first main electrode that receives the first power supply voltage and a control electrode that receives the output voltage of the differential amplifier, the first base current generating circuit generating the first base current according to a current flowing from a second main electrode of the second P-type transistor,
    the second base current generating circuit includes at least one first N-type transistor having a first main electrode that receives the ground voltage and a control electrode that receives a second divided voltage generated by the voltage divider circuit, the second base current generating circuit generating the second base current according to a current flowing into a second main electrode of the first N-type transistor, and
    the second divided voltage is set at a zero temperature coefficient point of the first N-type transistor.

5. The semiconductor device according to claim 4, wherein the first base current generating circuit includes the at least one second P-type transistor comprising a plurality of second P-type transistors, the first base current being trimmed by turning on or off switch transistors coupled in series to the respective second P-type transistors, and
    the second base current generating circuit includes the at least one first N-type transistor comprising a plurality of first N-type transistors, the second base current being trimmed by turning on or off switch transistors coupled in series to the respective first N-type transistors.

6. The semiconductor device according to claim 2, wherein the reference current generating circuit further includes:
    a differential amplifier having a first input terminal that receives a reference voltage generated by a bandgap reference circuit;
    a first P-type transistor having a first main electrode that receives a first power supply voltage and a control electrode that receives an output voltage of the differential amplifier;
    a voltage divider circuit coupled between a second main electrode of the first P-type transistor and a ground node for supplying a ground voltage, the voltage divider circuit generating a first divided voltage to be supplied to a second input terminal of the differential amplifier, and
    the first and second base current generating circuits, the temperature-compensating current generating circuit, and the voltage-compensating current generating circuit generate the first and second base currents, the temperature compensating current, and the voltage compensating current, respectively, according to a divided voltage generated by the voltage divider circuit.

7. The semiconductor device according to claim 6, wherein the first base current generating circuit includes:
    a first N-type transistor having a first main electrode that receives the ground voltage and a control electrode that receives a second divided voltage generated by the voltage divider circuit;
    a second P-type transistor having a first main electrode that receives the first power supply voltage, the second P-type transistor being coupled in series to the first N-type transistor; and
    a third P-type transistor including a current mirror with the second P-type transistor,
    the first base current generating circuit generates the first base current according to a current flowing from a drain of the third P-type transistor,
    the second base current generating circuit including at least one second N-type transistor having a first main electrode that receives the ground voltage and a control electrode that receives the second divided voltage, the second base current generating circuit generating the second base current according to a current flowing into a second main electrode of the second N-type transistor, and the second divided voltage is set at zero temperature coefficient points of the first and second N-type transistors.

8. The semiconductor device according to claim 7, wherein the first base current generating circuit includes the at least one third P-type transistor comprising a plurality of third P-type transistors, the first base current being trimmed by turning on or off switch transistors coupled in series to the respective third P-type transistors, and the second base current generating circuit includes the at least one second N-type transistor comprising a plurality of second N-type transistors, the second base current being trimmed by turning on or off switch transistors coupled in series to the respective second N-type transistors.

9. The semiconductor device according to claim 2, wherein the reference current generating circuit further includes:

a differential amplifier having a first input terminal that receives a reference voltage generated by a bandgap reference circuit;

a first P-type transistor having a first main electrode that receives a first power supply voltage and a control electrode that receives an output voltage of the differential amplifier; and a voltage divider circuit coupled between a second main electrode of the first P-type transistor and a ground node for supplying of a ground voltage, the voltage divider circuit generating a first divided voltage to be supplied to a second input terminal of the differential amplifier, the first and second base current generating circuits generate the first and second base currents according to the output voltage of the differential amplifier, and the temperature-compensating current generating circuit and the voltage-compensating current generating circuit generate the temperature compensating current and the voltage compensating current, respectively, according to a divided voltage generated by the voltage divider circuit.

10. The semiconductor device according to claim 9, wherein the first base current generating circuit includes at least one second P-type transistor having a first main electrode that receives the first power supply voltage and a control electrode that receives the output voltage of the differential amplifier, the first base current generating circuit generating the first base current according to a current flowing from a second main electrode of the second P-type transistor, and the second base current generating circuit includes a current mirror circuit that is included of a plurality of first N-type transistors and a switch circuit that switches paths of current flowing from the second main electrode of the second P-type transistor and guides the current to the current mirror circuit, the second base current generating circuit generating the second base current according to a current copied by the current mirror circuit according to a mirror ratio.

11. The semiconductor device according to claim 10, wherein the first base current generating circuit includes the at least one second P-type transistor comprising a plurality of second P-type transistors, and the reference current generating circuit trims the first and second base currents by turning on or off switch transistors coupled in series to the respective second P-type transistors.

12. The semiconductor device according to claim 9, wherein the first base current generating circuit includes at least one second P-type transistor having a first main electrode that receives the first power supply voltage and a control electrode that receives the output voltage of the differential amplifier, the first base current generating circuit generating the first base current according to a current flowing from a second main electrode of the second P-type transistor, and the second base current generating circuit includes at least one third P-type transistor having a first main electrode that receives the first power supply voltage and a control electrode that receives an output voltage of the differential amplifier, the second base current generating circuit generating the second base current according to a current flowing from a second main electrode of the third P-type transistor.

13. The semiconductor device according to claim 12, wherein the first base current generating circuit includes the at least one second P-type transistor comprising a plurality of second P-type transistors, the first base current being trimmed by turning on or off switch transistors coupled in series to the respective second P-type transistors, and the second base current generating circuit includes the at least one third P-type transistor comprising a plurality of second P-type transistors, the second base current being trimmed by turning on or off switch transistors coupled in series to the respective third P-type transistors.

14. The semiconductor device according to claim 9, wherein the temperature-compensating current generating circuit includes at least one second N-type transistor having a first main electrode that receives the ground voltage and a control electrode that receives a second divided voltage generated by the voltage divider circuit, the temperature-compensating current generating circuit generating the temperature compensating current according to a current flowing into a second main electrode of the second N-type transistor, and the second divided voltage is set at a different value from a zero temperature coefficient point of the second N-type transistor.

15. The semiconductor device according to claim 9, wherein the voltage-compensating current generating circuit includes at least one fourth P-type transistor having a first main electrode that receives a second power supply voltage lower than the first power supply voltage and a control electrode that receives a third divided voltage generated by the voltage divider circuit, the voltage-compensating current generating circuit generating the voltage compensating current according to a current flowing from a second main electrode of the fourth P-type transistor, and a voltage obtained by subtracting the second power supply voltage from the third divided voltage is set at a zero temperature coefficient point of the fourth P-type transistor.

16. The semiconductor device according to claim 15, wherein the second power supply voltage is used for the memory cell to be read during data reading.

17. The semiconductor device according to claim 9, wherein the voltage-compensating current generating circuit includes:

a third N-type transistor having a first main electrode that receives the ground voltage and a control electrode that receives a second power supply voltage lower than the first power supply voltage; and a fourth N-type transistor having a first main electrode that receives the ground voltage and a control electrode that receives a fourth divided voltage generated by the voltage divider circuit, the voltage-compensating current generating circuit generates the voltage compensating current according to a current obtained by subtracting a current flowing into a second main electrode of the fourth N-type transistor from a current flowing into a second main electrode of the third N-type transistor, the second power supply voltage is used for the memory cell to be read during data reading, and the fourth divided voltage is set equal to a design value of the second power supply voltage.

18. A semiconductor device comprising a reference current generating circuit that generates a reference current, the reference current includes a first current, a second current flowing opposite to the first current, a third current flowing in a same direction as the first current, and a fourth current flowing in the same direction as the first current, the reference current generating circuit including:

a differential amplifier having a first input terminal that receives a reference voltage generated by a bandgap reference circuit;

a first P-type transistor having a first main electrode that receives a first power supply voltage and a control electrode that receives an output voltage of the differential amplifier; and a voltage divider circuit coupled between a second main electrode of the first P-type transistor and a ground node for supplying a ground voltage, the voltage divider circuit generating a first divided voltage to be supplied to a second input terminal of the differential amplifier, and first to fourth current generating circuits that generate the first to fourth currents, the first current generating circuit including a second P-type transistor having a first main electrode that receives the first power supply voltage and a control electrode that receives the output voltage of the differential amplifier, the first current generating circuit generating the first current according to a current flowing from a second main electrode of the second P-type transistor, the second current generating circuit including a current mirror circuit that is included of a plurality of first N-type transistors and a switch circuit that switches paths of current flowing from the second main electrode of the second P-type transistor and guides the current to the current mirror circuit, the second base current generating circuit generating the second base current according to a current copied by the current mirror circuit according to a mirror ratio, the third current generating circuit including a second N-type transistor having a first main electrode that receives the ground voltage and a control electrode that receives a second divided voltage generated by the voltage divider circuit, the third current generating circuit generating the third current according to a current flowing into a second main electrode of the second N-type transistor, the second divided voltage being set at a different value from a zero temperature coefficient point of the second N-type transistor, the fourth current generating circuit including a third P-type transistor having a first main electrode that receives a second power supply voltage different from the first power supply voltage and a control electrode that receives a third divided voltage generated by the voltage divider circuit, the fourth current generating circuit generating the fourth current according to a current flowing from a second main electrode of the third P-type transistor, the second power supply voltage being subtracted from the third divided voltage to obtain a value corresponding to a zero temperature coefficient point of the third P-type transistor.

19. A semiconductor device comprising a reference current generating circuit that generates a reference current, the reference current includes a first current, a second current flowing opposite to the first current, a third current flowing in a same direction as the first current, and a fourth current flowing in the same direction as the first current, the reference current generating circuit including:

a differential amplifier having a first input terminal that receives a reference voltage generated by a bandgap reference circuit;

a first P-type transistor having a first main electrode that receives a first power supply voltage and a control electrode that receives an output voltage of the differential amplifier; and a voltage divider circuit coupled between a second main electrode of the first P-type transistor and a ground node for supplying a ground voltage, the voltage divider circuit generating a first divided voltage to be supplied to a second input terminal of the differential amplifier, and first to fourth current generating circuits that generate the first to fourth currents, the first current generating circuit including a second P-type transistor having a first main electrode that receives the first power supply voltage and a control electrode that receives the output voltage of the differential amplifier, the first current generating circuit generating the first current according to a current flowing from a second main electrode of the second P-type transistor, the second current generating circuit including a third P-type transistor having a second main electrode that receives the first power supply voltage and a control electrode that receives an output voltage of the differential amplifier, the second current generating circuit generating the second current according to a current flowing from the second main electrode of the third P-type transistor, the third current generating circuit including a second N-type transistor having a first main electrode that receives the ground voltage and a control electrode that receives a second divided voltage generated by the voltage divider circuit, the third current generating circuit generating the third current according to a current flowing into a second main electrode of the second N-type transistor, the second divided voltage being set at a different value from a zero temperature coefficient point of the second N-type transistor, the fourth current generating circuit including a fourth P-type transistor having a first main electrode that receives a second power supply voltage different from the first power supply voltage and a control electrode that receives a third divided voltage generated by the voltage divider circuit, the fourth current generating circuit generating the fourth current according to a current flowing from a second main electrode of the fourth P-type transistor, the second power supply voltage being subtracted from the third divided voltage to obtain a value corresponding to a zero temperature coefficient point of the third P-type transistor.

\* \* \* \* \*